US012660155B2

(12) United States Patent
Shin et al.

(10) Patent No.: US 12,660,155 B2
(45) Date of Patent: Jun. 16, 2026

(54) METHOD OF MANUFACTURING SEMICONDUCTOR MEMORY DEVICES

(71) Applicant: SAMSUNG ELECTRONICS CO., LTD., Suwon-si (KR)

(72) Inventors: Seokho Shin, Seoul (KR); Taegyu Kang, Hwaseong-si (KR); Byeungmoo Kang, Busan (KR); Joongchan Shin, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 533 days.

(21) Appl. No.: 18/144,958

(22) Filed: May 9, 2023

(65) Prior Publication Data

US 2023/0276614 A1     Aug. 31, 2023

Related U.S. Application Data

(63) Continuation of application No. 17/471,778, filed on Sep. 10, 2021, now Pat. No. 11,653,490.

(30) Foreign Application Priority Data

Sep. 11, 2020     (KR) ......................... 10-2020-0117044

(51) Int. Cl.
*H10B 12/00* (2023.01)

(52) U.S. Cl.
CPC ............. *H10B 12/30* (2023.02); *H10B 12/03* (2023.02); *H10B 12/05* (2023.02)

(58) Field of Classification Search
CPC ........ H10B 12/03; H10B 12/05; H10B 12/30; H10B 12/31; H10B 12/482; H10B 12/488; H10B 43/20; H10D 62/402
See application file for complete search history.

(56) References Cited

U.S. PATENT DOCUMENTS

| | | | |
|---|---|---|---|
| 6,104,061 A | 8/2000 | Forbes et al. | |
| 7,379,316 B2 | 5/2008 | Rajan | |

(Continued)

FOREIGN PATENT DOCUMENTS

| | | |
|---|---|---|
| KR | 1020190060251 A | 6/2019 |
| KR | 1020190080688 A | 7/2019 |

(Continued)

OTHER PUBLICATIONS

Notice of Allowance dated Aug. 28, 2024 for corresponding KR Patent Application No. 10-2020-0117044.
Taiwanese Notice of Allowance dated Jul. 11, 2022.

*Primary Examiner* — Britt Hanley
*Assistant Examiner* — Kevin Quinto
(74) *Attorney, Agent, or Firm* — Muir Patent Law, PLLC

(57) ABSTRACT

A semiconductor memory device including a substrate; a semiconductor pattern extending in a first horizontal direction on the substrate; bit lines extending in a second horizontal direction on the substrate perpendicular to the first horizontal direction, the bit lines being at a first end of the semiconductor pattern; word lines extending in a vertical direction on the substrate at a side of the semiconductor pattern; a capacitor structure on a second end of the semiconductor pattern opposite to the first end in the first horizontal direction, the capacitor structure including a lower electrode connected to the semiconductor pattern, an upper electrode spaced apart from the lower electrode, and a capacitor dielectric layer between the lower electrode and the upper electrode; and a capacitor contact layer between the second end of the semiconductor pattern and the lower electrode and including a pair of convex surfaces in contact with the semiconductor pattern.

20 Claims, 50 Drawing Sheets

(56)                    References Cited

U.S. PATENT DOCUMENTS

|  |  |  |  |
|---|---|---|---|
| 8,053,822 B2 | 11/2011 | Kim et al. | |
| 8,980,699 B2 | 3/2015 | Tang | |
| 9,023,723 B2 | 5/2015 | Chang et al. | |
| 9,142,557 B2 | 9/2015 | Lee | |
| 9,236,417 B2 | 1/2016 | Park | |
| 9,799,761 B2 | 10/2017 | Or-Bach et al. | |
| 10,468,414 B2 | 11/2019 | Kim et al. | |
| 10,636,473 B2 | 4/2020 | Luan | |
| 2003/0227802 A1 | 12/2003 | Aochi et al. | |
| 2006/0270151 A1 | 11/2006 | Lee | |
| 2009/0224362 A1 | 9/2009 | Lu et al. | |
| 2017/0053906 A1 | 2/2017 | Or-Bach et al. | |
| 2019/0103406 A1* | 4/2019 | Tang ..................... | H10B 12/33 |
| 2020/0279601 A1 | 9/2020 | Kim et al. | |

FOREIGN PATENT DOCUMENTS

| KR | 1020190131592 A | 11/2019 |
|---|---|---|
| KR | 1020200105216 A | 9/2020 |
| TW | 201532247 A | 8/2015 |

* cited by examiner

METHOD OF MANUFACTURING SEMICONDUCTOR MEMORY DEVICES

CROSS-REFERENCE TO RELATED APPLICATIONS

This is a continuation application based on pending application Ser. No. 17/471,778, filed Sep. 10, 2021, the entire contents of which is hereby incorporated by reference.

Korean Patent Application No. 10-2020-0117044, filed on Sep. 11, 2020, in the Korean Intellectual Property Office, and entitled: "Semiconductor Memory Devices," is incorporated by reference herein in its entirety.

BACKGROUND

1. Field

Embodiments relate to semiconductor memory devices.

2. Description of the Related Art

As electronic products become smaller, multifunctional, and have high performance, in high-capacity semiconductor memory devices, a degree of integration may be increased to provide high-capacity semiconductor memory devices.

SUMMARY

The embodiments may be realized by providing a semiconductor memory device including a substrate; a semiconductor pattern extending in a first horizontal direction on the substrate; bit lines extending in a second horizontal direction on the substrate, the second horizontal direction being perpendicular to the first horizontal direction, the bit lines being at a first end of the semiconductor pattern; word lines extending in a vertical direction on the substrate, the word lines being at a side of the semiconductor pattern; a capacitor structure on a second end of the semiconductor pattern opposite to the first end in the first horizontal direction, the capacitor structure including a lower electrode connected to the semiconductor pattern, an upper electrode spaced apart from the lower electrode, and a capacitor dielectric layer between the lower electrode and the upper electrode; and a capacitor contact layer between the second end of the semiconductor pattern and the lower electrode, the capacitor contact layer including a pair of convex surfaces in contact with the semiconductor pattern.

The embodiments may be realized by providing a semiconductor memory device including a substrate; a plurality of semiconductor patterns extending in a first horizontal direction on the substrate, the plurality of semiconductor patterns being spaced apart from each other in a vertical direction; a plurality of bit lines extending in a second horizontal direction on the substrate, the second horizontal direction being perpendicular to the first horizontal direction, the plurality of bit line being spaced apart from each other in the vertical direction and on a first end of each of the plurality of semiconductor patterns; a plurality of word lines extending in the vertical direction on the substrate, the plurality of word lines being on sides of the plurality of semiconductor patterns; a capacitor structure on a second end of each of the plurality of semiconductor patterns opposite to the first end in the first horizontal direction, the capacitor structure including a plurality of lower electrodes spaced apart from each other in the vertical direction; a plurality of support layers between two adjacent lower electrodes among the plurality of lower electrodes; and a plurality of capacitor contact layers between the second end of each of the plurality of semiconductor patterns and the plurality of lower electrodes, wherein the second end of each of the plurality of semiconductor patterns includes a pair of recessed portions.

The embodiments may be realized by providing a semiconductor memory device a substrate; a plurality of semiconductor patterns extending in a first horizontal direction on the substrate, the plurality of semiconductor patterns being spaced apart from each other in a vertical direction; a plurality of bit lines extending in a second horizontal direction on the substrate, the second horizontal direction being perpendicular to the first horizontal direction, the plurality of bit lines being spaced apart from each other in the vertical direction, and being on a first end of each of the plurality of semiconductor patterns; a pair of gate electrodes on the substrate and spaced apart from each other in the second horizontal direction, the pair of gate electrodes extending in the vertical direction and being on opposite sides of the plurality of semiconductor patterns; a capacitor structure on a second end of each of the plurality of semiconductor patterns opposite to the first end in the first horizontal direction, the capacitor structure including a plurality of lower electrodes spaced apart from each other in the vertical direction; a plurality of support layers alternately provided with the plurality of lower electrodes in the vertical direction; and a plurality of capacitor contact layers between the second end of each of the plurality of semiconductor patterns and the plurality of lower electrodes, the plurality of capacitor contact layers including a metal silicide, wherein the plurality of capacitor contact layers each include a pair of convex surfaces in contact with the plurality of semiconductor patterns.

BRIEF DESCRIPTION OF THE DRAWINGS

Features will be apparent to those of skill in the art by describing in detail exemplary embodiments with reference to the attached drawings in which:

FIG. 3 is a cross-sectional view taken along lines A1-A1' and A2-A2' of FIG. 2;

FIG. 11 is a cross-sectional view of a semiconductor memory device according to embodiments;

FIG. 12 is a cross-sectional view of a semiconductor memory device according to embodiments; and FIGS. 13 to 27B illustrate stages in a method of manufacturing a semiconductor memory device according to embodiments. Specifically, FIGS. 13, 14A, 15A, 16A, 17A, 18A, 19A, 20A, 21, 22A, 23A, 24A, 25A, 26A, and 27A are cross-sectional views taken along lines A1-A1' and A2-A2' of FIG. 2. FIGS. 14B, 15B, 16B, 17B, 18B, 19B, 20B, 22B, 23B, 24B, 25B, 26B, and 27B are cross-sectional views taken along line B1-B1' of FIG. 2.

DETAILED DESCRIPTION

Figure 1:
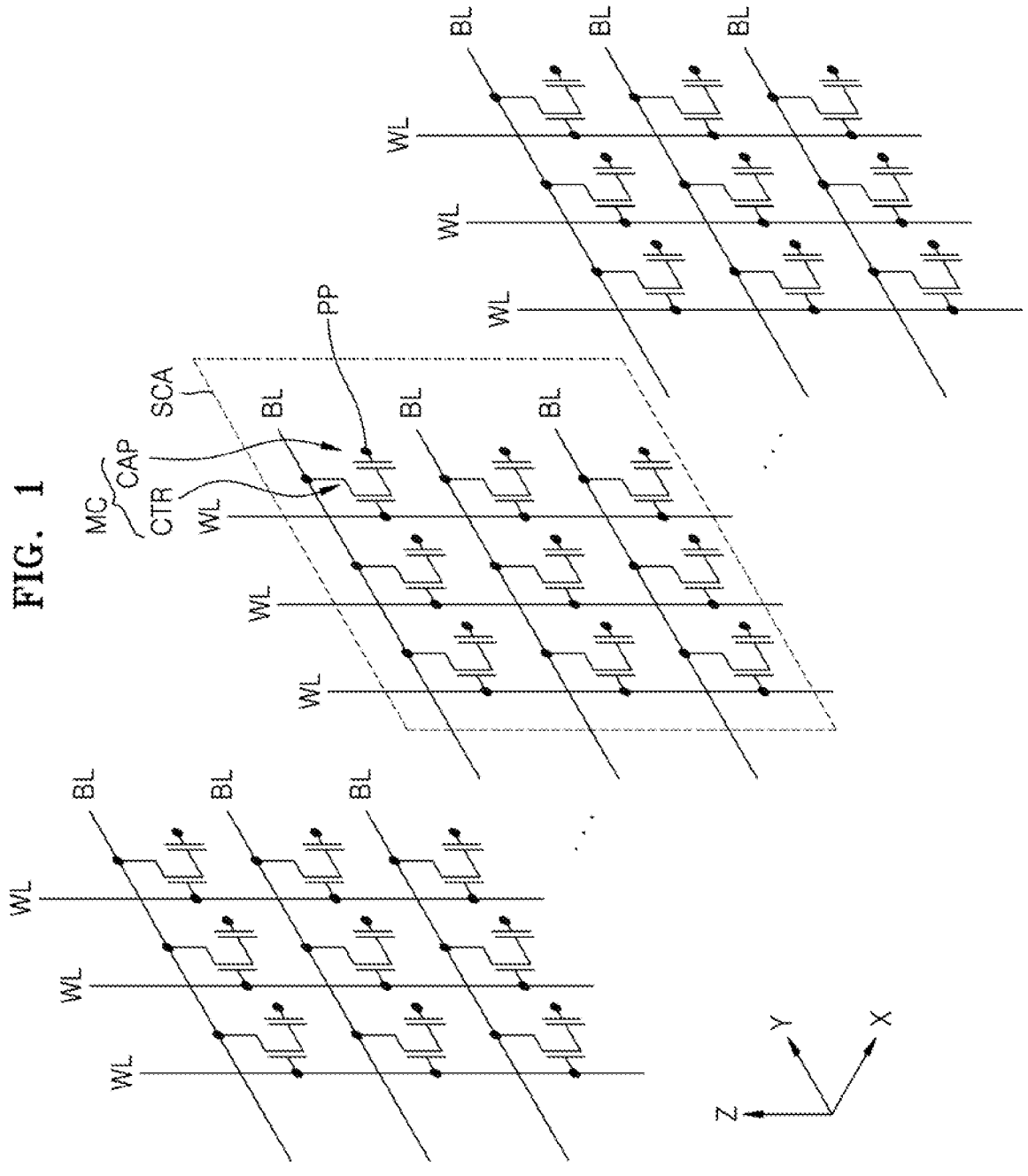
FIG. 1 is an equivalent circuit diagram of a cell array of a semiconductor memory device according to embodiments.

FIG. 1 is an equivalent circuit diagram of a cell array of a semiconductor memory device according to embodiments.

Referring to FIG. 1, a cell array of a semiconductor memory device may include a plurality of sub-cell arrays SCA. The plurality of sub-cell arrays SCA may be arranged in a first horizontal direction X.

The sub cell array SCA may include a plurality of bit lines BL, a plurality of word lines WL, and a plurality of cell transistors CTR. One cell transistor CTR may be between one word line WL and one bit line BL.

The plurality of bit lines BL may be a conductive pattern (e.g., metal lines) on a substrate and spaced apart from the substrate. The plurality of bit lines BL may extend in a second horizontal direction Y. Bit lines BL in one sub cell array SCA may be spaced apart from each other in a vertical direction Z.

The word lines WL may be a conductive pattern (e.g., metal lines) extending from the substrate in the vertical direction Z. Word lines WL in one sub cell array SCA may be spaced apart from each other in the second horizontal direction Y.

A gate of the memory cell transistor CTR may be connected to the word lines WL, and a source of the memory cell transistor CTR may be connected to the bit lines BL. The cell transistor CTR may be connected to a cell capacitor CAP. A drain of the cell transistor CTR may be connected to a first electrode of the cell capacitor CAP, and a second electrode of the cell capacitor CAP may be connected to a ground interconnection PP.

Figure 2:
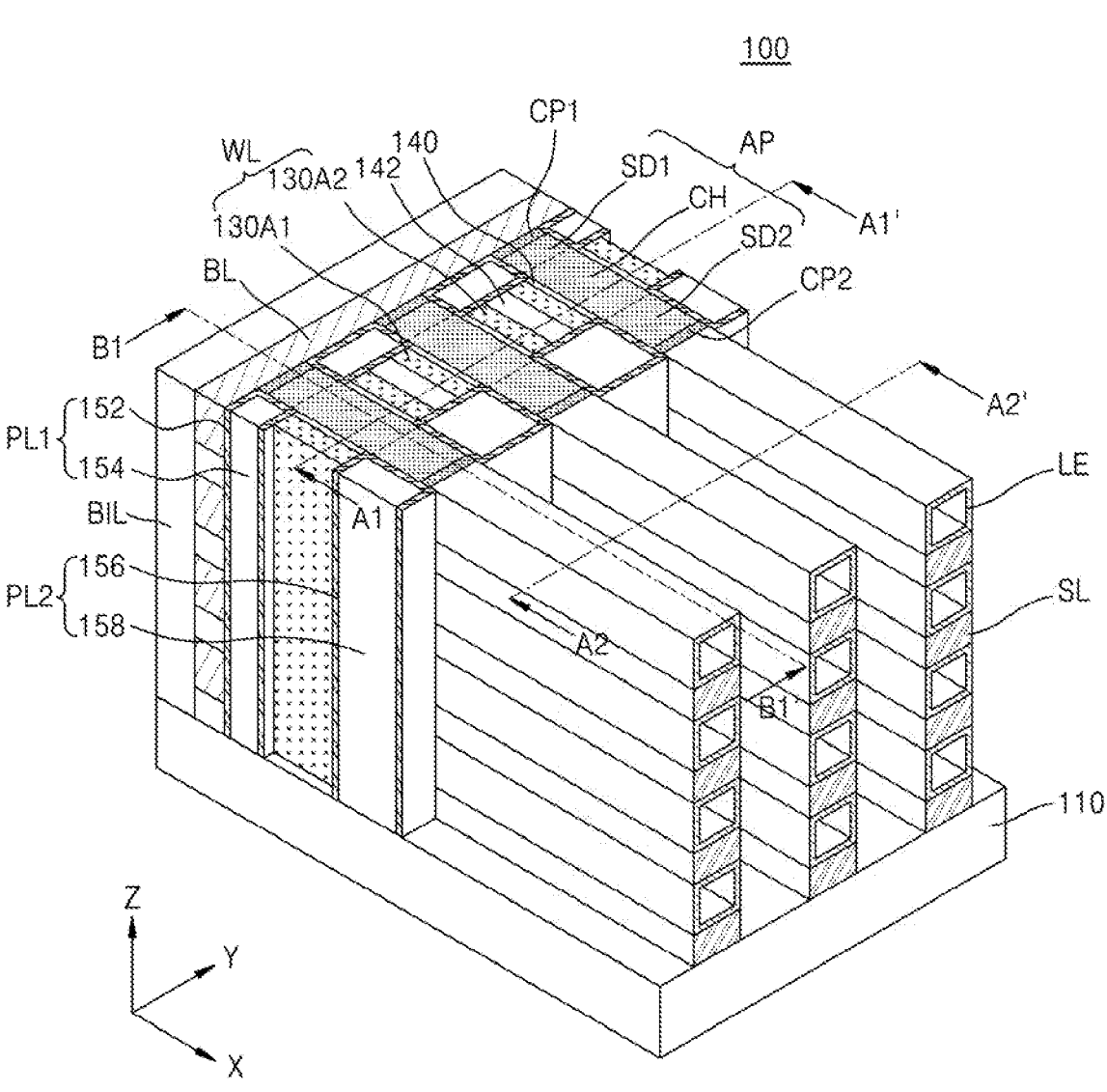
FIG. 2 is a perspective view of a semiconductor memory device according to embodiments.
Figure 3:
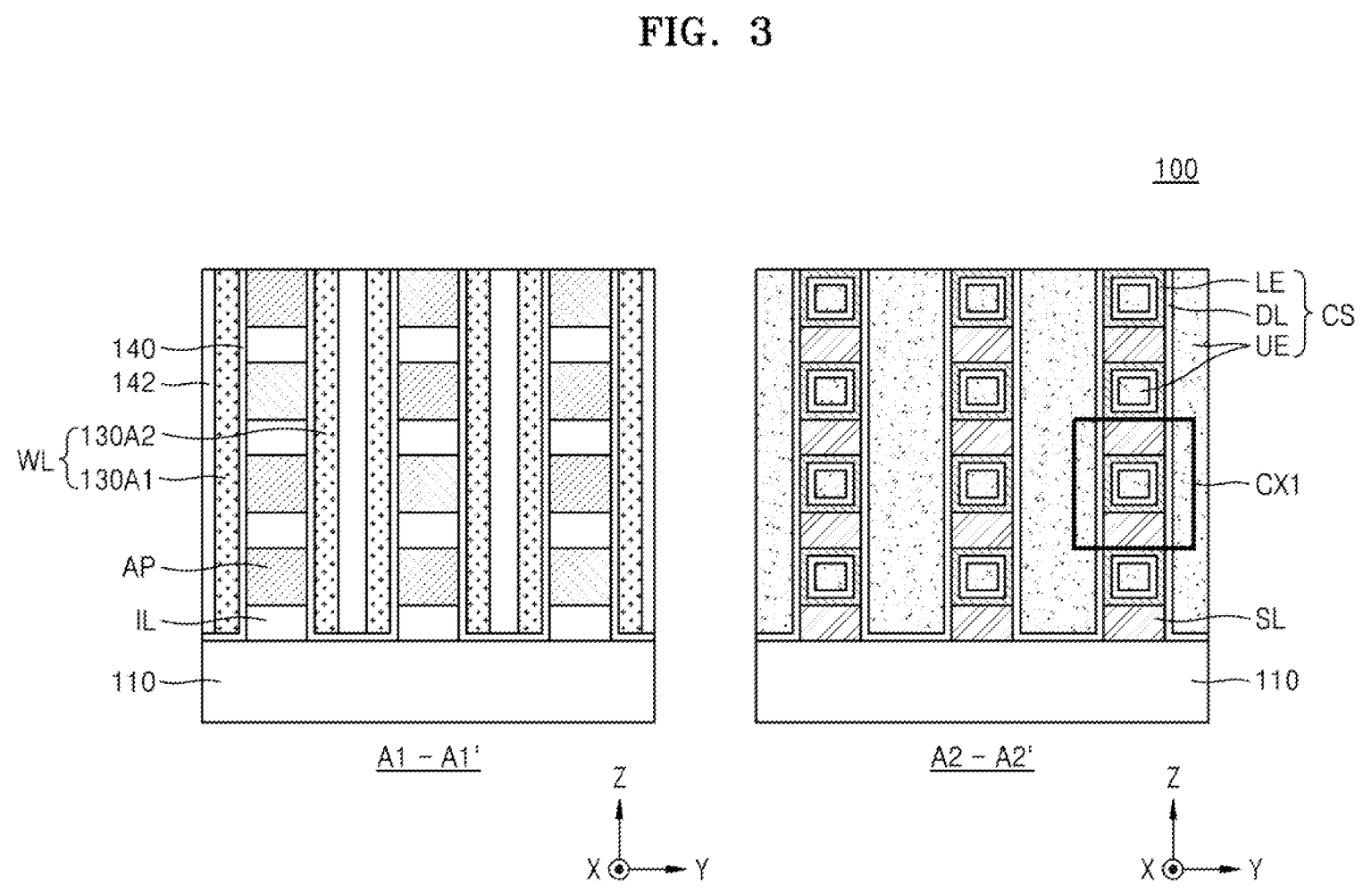
Figure 4:
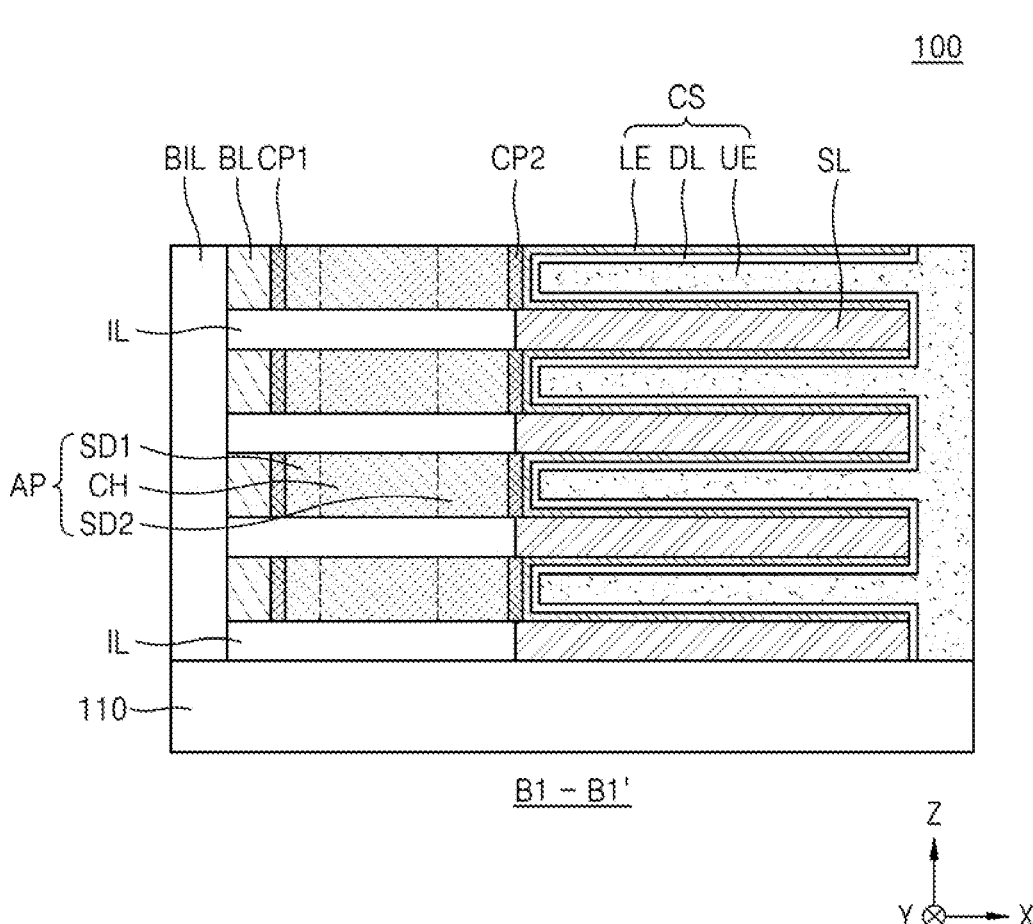
FIG. 4 is a cross-sectional view taken along line B1-B1' of FIG. 2.
Figure 5:
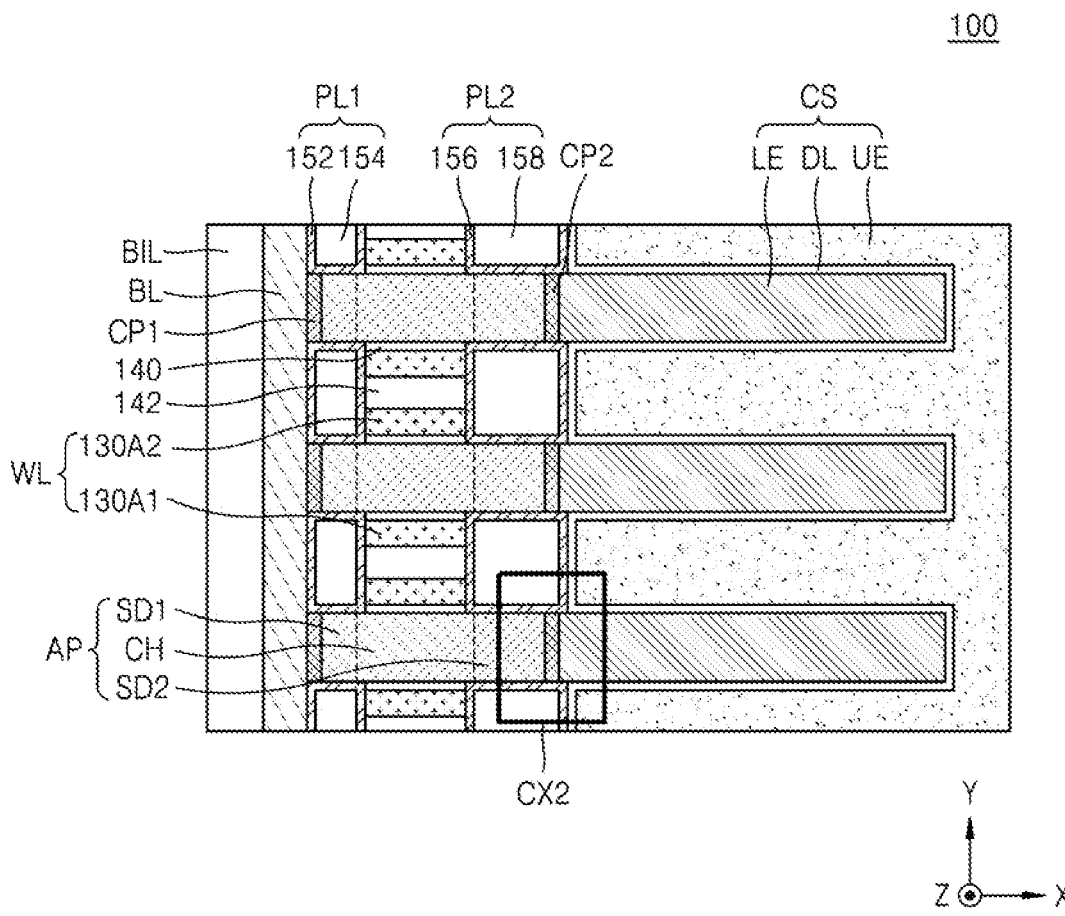
FIG. 5 is a top view of a semiconductor memory device.
Figure 6:
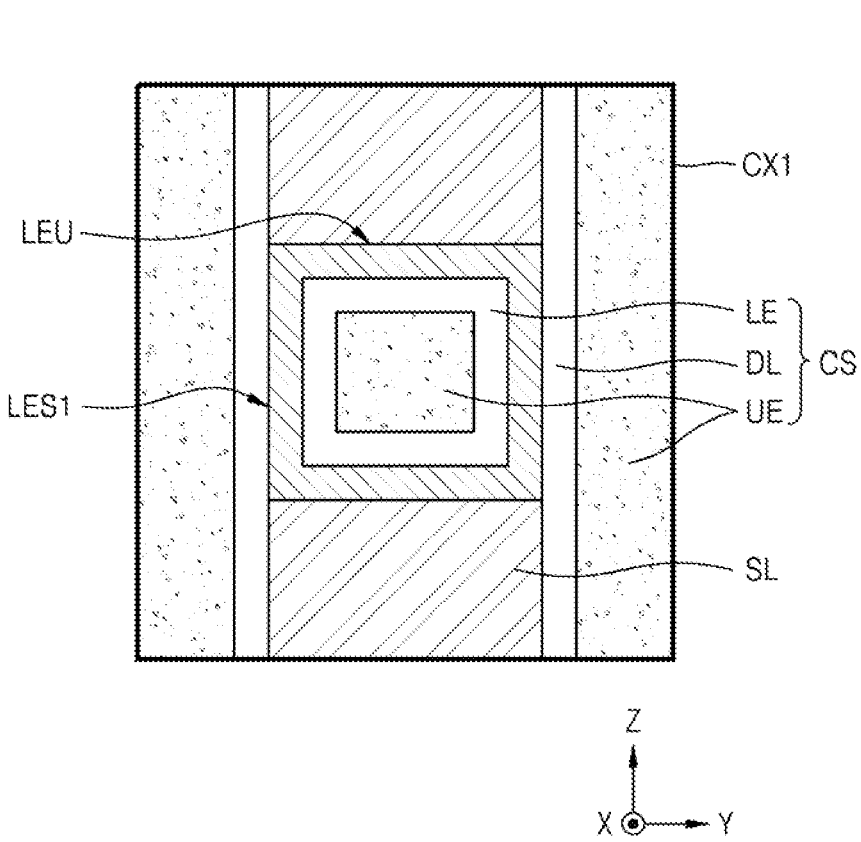
FIG. 6 is an enlarged view of a region CX1 of FIG. 3.
Figure 7:
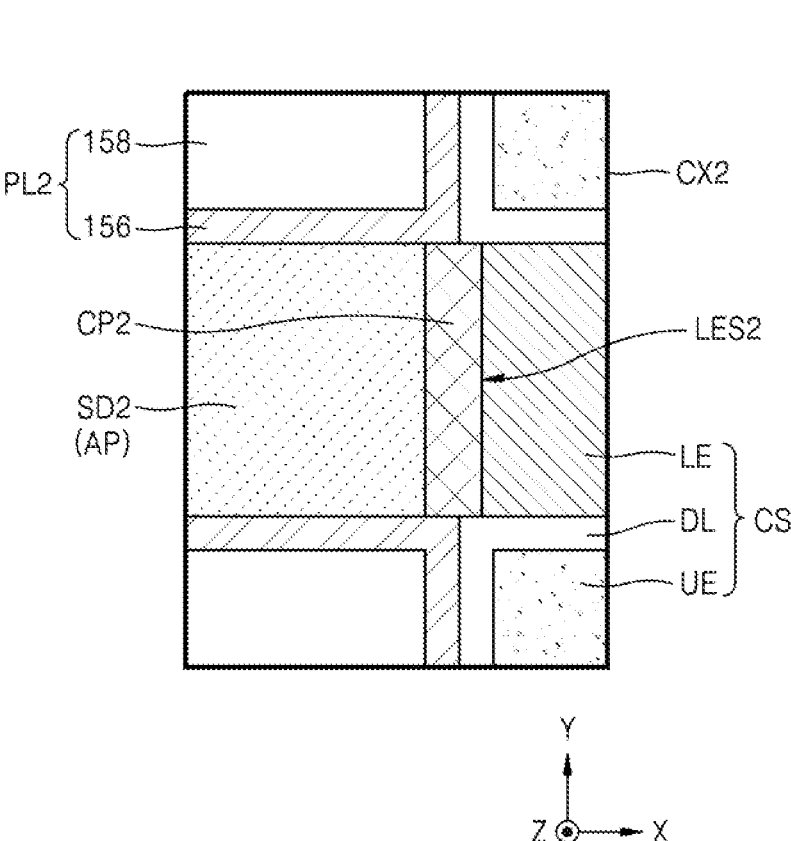
FIG. 7 is an enlarged view of a region CX2 of FIG. 5.

FIG. 2 is a perspective view of a semiconductor memory device 100 according to embodiments. FIG. 3 is a cross-sectional view taken along lines A1-A1' and A2-A2' of FIG. 2. FIG. 4 is a cross-sectional view taken along line B1-B1' of FIG. 2. FIG. 5 is a top view of the semiconductor memory device 100. FIG. 6 is an enlarged view of a region CX1 of FIG. 3. FIG. 7 is an enlarged view of a region CX2 of FIG. 5. In FIG. 2, for convenience of illustration, a gate dielectric layer DL and an upper electrode UE are omitted.

Referring to FIGS. 2 to 7, the semiconductor memory device 100 may include a plurality of semiconductor patterns AP, a plurality of bit lines BL, a plurality of word lines WL, and a capacitor structure CS, which are on the substrate 110.

The substrate 110 may include Si, Ge, or SiGe. In an implementation, the substrate 110 may include a silicon-on-insulator (SOI) substrate or a germanium-on-insulator (GeOI) substrate. In an implementation, a peripheral circuit and an interconnection layer connected to the peripheral circuit may be further provided on a region of the substrate 110.

A plurality of semiconductor patterns AP may extend (e.g., lengthwise) on the substrate 110 in a first horizontal direction X and may be spaced apart from each other in a vertical direction Z. A mold insulating layer IL may be between the plurality of semiconductor patterns AP.

The plurality of semiconductor patterns AP may be formed of, e.g., an undoped semiconductor material or a doped semiconductor material. In an implementation, the plurality of semiconductor patterns AP may be formed of polysilicon. In an implementation, the plurality of semiconductor patterns AP may include an amorphous metal oxide, a polycrystalline metal oxide, or a combination thereof, e.g., In—Ga-based oxide (IGO), In—Zn-based oxide (IZO), or In—Ga—Zn-based oxide (IGZO). In an implementation, the plurality of semiconductor patterns AP may include a 2D material semiconductor. In an implementation, the 2D material semiconductor may include $MoS_2$, $WSe_2$, graphene, carbon nano tube, or a combination thereof. As used herein, the term "or" is not an exclusive term, e.g., "A or B" would include A, B, or A and B.

The plurality of semiconductor patterns AP may have a line or bar shape extending (e.g., lengthwise) in the first horizontal direction X. Each of the semiconductor patterns AP may include a channel region CH, and a first impurity region SD1 and a second impurity region SD2 in or along the first horizontal direction X, e.g., with the channel region CH between the first impurity region SD1 and the second impurity region SD2. The first impurity region SD1 may be connected to the bit lines BL, and the second impurity region SD2 may be connected to the capacitor structure CS.

The word lines WL may be on at least one sidewall of the plurality of semiconductor patterns AP and extend in a vertical direction Z. The semiconductor memory device 100 may have a double gate transistor structure. In an implementation, each of the word lines WL may include a first gate electrode 130A1 and a second gate electrode 130A2 on opposite sidewalls of one of the plurality of semiconductor patterns AP.

The first gate electrode 130A1 and the second gate electrode 130A2 may include a doped semiconductor material (doped silicon, doped germanium, or the like), a conductive metal nitride (titanium nitride, tantalum nitride, or the like), a metal (tungsten, titanium, tantalum, or the like), or a metal-semiconductor compound (tungsten silicide, cobalt silicide, titanium silicide, or the like).

A gate insulating layer 140 may be between the first gate electrode 130A1 and the semiconductor patterns AP and between the second gate electrode 130A2 and the semiconductor patterns AP. The gate insulating layer 140 may be formed of a high-k dielectric material having a higher dielectric constant than silicon oxide or a ferroelectric material. In an implementation, the gate insulating layer 140 may be formed of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), lead zirconate titanate (PZT), strontium bismuth tantalate (STB), bismuth iron oxide (BFO), strontium titanium oxide (SrTiO), yttrium oxide (YO), aluminum oxide (AlO), or lead scandium tantalum oxide (PbScTaO).

A gap-fill insulating layer 142 may be between a first gate electrode 130A1 on a sidewall of one semiconductor pattern AP and a second gate electrode 130A2 on a sidewall of another semiconductor pattern AP adjacent to the one semiconductor pattern AP. A space between the first gate electrode 130A1 and the second gate electrode 130A2 adjacent to each other may be filled with the gap-fill insulating layer 142. The gap-fill insulating layer 142 may include silicon oxide, silicon oxynitride, silicon nitride, carbon-containing silicon oxide, carbon-containing silicon oxynitride, carbon-containing silicon nitride, or a combination thereof.

The plurality of bit lines BL may extend on the substrate 110 in the second horizontal direction Y and may be spaced apart from each other in the vertical direction Z. The plurality of bit lines BL may include a doped semiconductor material, a conductive metal nitride, a metal (e.g., a non-compounded metal material), or a metal-semiconductor compound.

A contact layer CP1 may be between the plurality of bit lines BL and the plurality of semiconductor patterns AP connected thereto. The contact layer CP1 may include a metal silicide material, e.g., titanium silicide, tungsten silicide, cobalt silicide, or nickel silicide.

A capacitor contact layer CP2 may be between the plurality of semiconductor patterns AP and a lower electrode LE connected thereto. In an implementation, as illustrated in FIG. 7, one end of a semiconductor pattern AP may be recessed inwardly (e.g., in a direction toward the bit lines BL) with respect to a sidewall of a second vertical insulating structure PL2, and a portion of a sidewall of a capacitor contact layer CP2 may be in contact (e.g., direct contact) with the sidewall of the second vertical insulating structure PL2.

The capacitor contact layer CP2 may include a metal silicide material, e.g., titanium silicide, tungsten silicide, cobalt silicide, or nickel silicide. In an implementation, the capacitor contact layer CP2 may have a thickness of about 20 mm to about 100 nm. The capacitor contact layer CP2 may be obtained by forming a barrier metal layer 230 (see FIG. 21A) on exposed surfaces of a support layer SL and the semiconductor pattern AP and performing a heat treatment process on the barrier metal layer 230, before the lower electrode LE is formed. In an implementation, the capacitor contact layer CP2 may be formed uniformly to a relatively large thickness on an entire exposed area of the semiconductor pattern AP.

A first vertical insulating structure PL1 may be on both sidewalls of a portion of the semiconductor pattern AP adjacent to the plurality of bit lines BL, and the second vertical insulating structure PL2 may be on both sides of a portion of the semiconductor pattern AP adjacent to the capacitor structure CS. The first vertical insulating structure PL1 may extend in the vertical direction Z, e.g., on sidewalls of the first impurity region SD1 and the contact layer CP1, and may include a first liner 152 and a first gap fill layer 154. The second vertical insulating structure PL2 may extend in the vertical direction Z on sidewalls of the second impurity region SD2 and the capacitor contact layer CP2, and may include a second liner 156 and a second gap fill layer 158.

The capacitor structure CS may include a plurality of lower electrodes LE, a capacitor dielectric layer DL, and an upper electrode UE. The plurality of lower electrodes LE may extend in the first horizontal direction X and may be spaced apart from each other in the vertical direction Z. Each of the plurality of lower electrodes LE may have an inner space extending in the first horizontal direction X, and the inner space may be filled with the capacitor dielectric layer DL and the upper electrode UE.

The plurality of lower electrodes LE and a plurality of support layers SL may be alternately arranged in the vertical direction Z. The plurality of lower electrodes LE may be at the same vertical level (e.g., the same distance from the substrate 110 in the vertical direction Z) as the plurality of semiconductor patterns AP. The plurality of support layers SL may be between the plurality of lower electrodes LE to help prevent the plurality of lower electrodes LE from collapsing or leaning in a process of forming the plurality of lower electrodes LE.

Each of the plurality of lower electrodes LE may include a pair of first sidewalls LES1 spaced apart from each other in the second horizontal direction Y, a second sidewall LES2 connected to the capacitor contact layer CP2, and a top surface LEU extending in the first horizontal direction X. As illustrated in FIG. 6, a vertical cross-section of each of the plurality of lower electrodes LE viewed from or as a Y-Z plane may have a closed loop shape. In addition, as illustrated in FIG. 7, the second sidewall LES2 may protrude in a direction toward the semiconductor pattern AP with respect to the sidewall of the second vertical insulating structure PL2. In an implementation, an end of a lower electrode LE adjacent to the second sidewall LES2 may be in contact with the second vertical insulating structure PL2.

The capacitor dielectric layer DL may be conformally provided in the inner space of the lower electrode LE, and on the pair of first sidewalls LES1 of the lower electrode LE and sidewalls of the support layer SL. The capacitor dielectric layer DL may not be on the top surface LEU of the lower electrode LE.

The capacitor dielectric layer DL may be formed of a high-k dielectric material having a higher dielectric constant than silicon oxide or a ferroelectric material. In an implementation, the capacitor dielectric layer DL may be formed of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), lead zirconate titanate (PZT), strontium bismuth tantalate (STB), bismuth iron oxide (BFO), strontium titanium oxide (SrTiO), yttrium oxide (YO), aluminum oxide (AlO), or lead scandium tantalum oxide (PbScTaO).

The upper electrode UE may cover the plurality of lower electrodes LE and the plurality of support layers SL, and the capacitor dielectric layer DL may be therebetween.

The lower electrode LE and the upper electrode UE may include a doped semiconductor material, a conductive metal nitride such as titanium nitride, tantalum nitride, niobium nitride or tungsten nitride, a metal such as ruthenium, iridium, titanium or tantalum, a conductive metal oxide such as iridium oxide or niobium oxide, or the like.

According to the above-described embodiments, the capacitor contact layer CP2 may be formed to a relatively large thickness between the lower electrode LE and the semiconductor pattern AP by, e.g., a manufacturing method to be described with reference to FIGS. 13 to 27B below. Accordingly, electrical resistance between the lower electrode LE and the semiconductor pattern AP may be reduced, and the semiconductor memory device 100 may have excellent operating characteristics.

Figure 8:
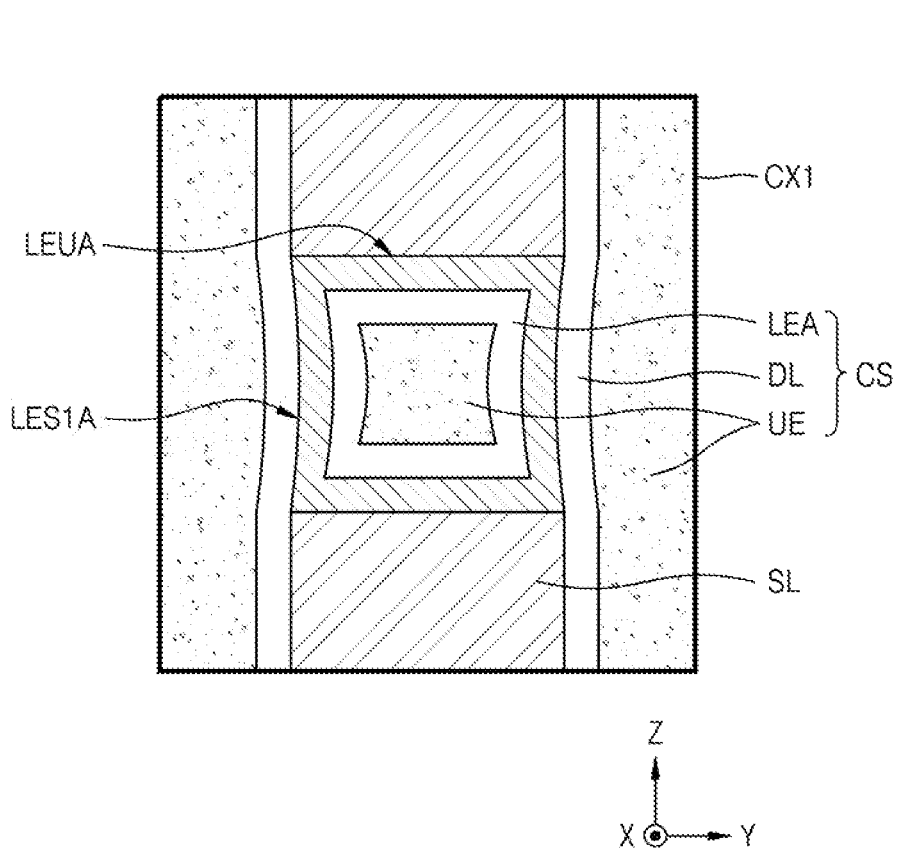
FIG. 8 is a cross-sectional view of a semiconductor memory device according to embodiments.
Figure 9:
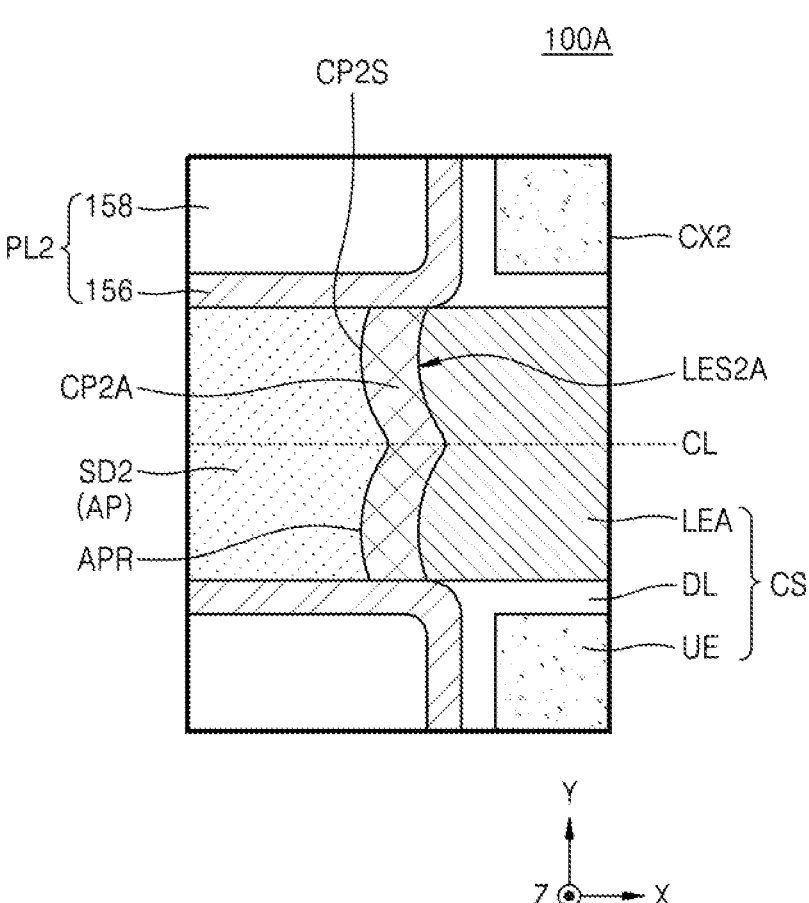
FIG. 9 is a top view of the semiconductor memory device of FIG. 8.

FIG. 8 is a cross-sectional view of a semiconductor memory device 100A according to embodiments. FIG. 9 is a top view of the semiconductor memory device 100A. FIG. 8 is an enlarged view of a portion corresponding to the region CX1 of FIG. 3. FIG. 9 is an enlarged view of a portion corresponding to the region CX2 of FIG. 5.

Referring to FIGS. 8 and 9, sidewalls of a semiconductor pattern AP may include a pair of recessed portions APR. The pair of recessed portions APR may be mirror symmetrical to each other with respect to or on either side in the second horizontal direction Y of a center line CL (e.g., bisecting the semiconductor pattern AP and extending in the first horizontal direction X). A capacitor contact layer CP2A may be conformally formed on the pair of recessed portions APR of the semiconductor pattern AP, and a second sidewall LES2A of a lower electrode LEA in contact with the capacitor contact layer CP2A may protrude toward the semiconductor pattern AP. In an implementation, the second sidewalls LES2A of the lower electrode LEA may have a (e.g., protruding or convex) shape conforming or complementary to the (e.g., concave) pair of recesses APR, and may be mirror symmetrical to each other with respect to the center line CL.

In a manufacturing process according to embodiments, in order to form the lower electrode LEA, a second opening OP2 may be formed to expose sidewalls of a channel mold layer 210 (see FIG. 19A) between support layers SL, and the channel mold layer 210 may be removed by performing a side recess process on the exposed sidewalls of the channel mold layer 210 through the second opening OP2. In an implementation, the side recess process may be performed by exposing the exposed sidewalls of the channel mold layer 210 to an etchant (such as an etching gas) through the second opening OP2. In the side recess process, a portion of a sidewall of the semiconductor pattern AP adjacent to the second opening OP2 may be exposed by the etchant and a pair of recessed portions APR may be formed on the portion of the sidewall of the semiconductor pattern AP. In an implementation, two second openings OP2 may be adjacent to both edges of one semiconductor pattern AP in a plan view, and the pair of recessed portions APR may be mirror symmetrical to each other with respect to the center line CL.

After removing the channel mold layer 210, the barrier metal layer 230 (see FIG. 21A) may be formed on an exposed surface, e.g., the pair of recessed portions APR, of the semiconductor pattern AP, and then be heat treated to form the capacitor contact layer CP2A. Accordingly, the capacitor contact layer CP2A may include a pair of convex surfaces CP2S protruding toward the pair of recessed portions APR. In an implementation, the capacitor contact layer CP2A may have a relatively uniform thickness over the entire area, and the second sidewalls LES2A of the lower electrode LEA in contact with the capacitor contact layer CP2A may also have a convex shape protruding toward the pair of recessed portions APR.

The lower electrode LEA may have a top surface LEUA, and may have a pair of first sidewalls LES1A spaced apart from each other in the second horizontal direction Y. The top surface LEUA of the lower electrode LEA may be in contact with the support layer SL and have a flat profile, e.g., without protrusions or recesses. The pair of first sidewalls LES1A may be concave inward toward each other with respect to a center of the lower electrode LEA.

In an implementation, in order to form the lower electrode LEA, after performing the side recess process, the barrier metal layer 230 may be formed and an etching process may be performed to remove the barrier metal layer 230 from the sidewalls of the support layers SL. In the etching process, a relatively large portion of a first gap-fill material layer 240 filling a space between the support layers SL may be removed, and in this case, profiles of the pair of first sidewalls LES1A of the lower electrode LEA may be concave inward toward each other with respect to the center of the lower electrode LEA.

Figure 10:
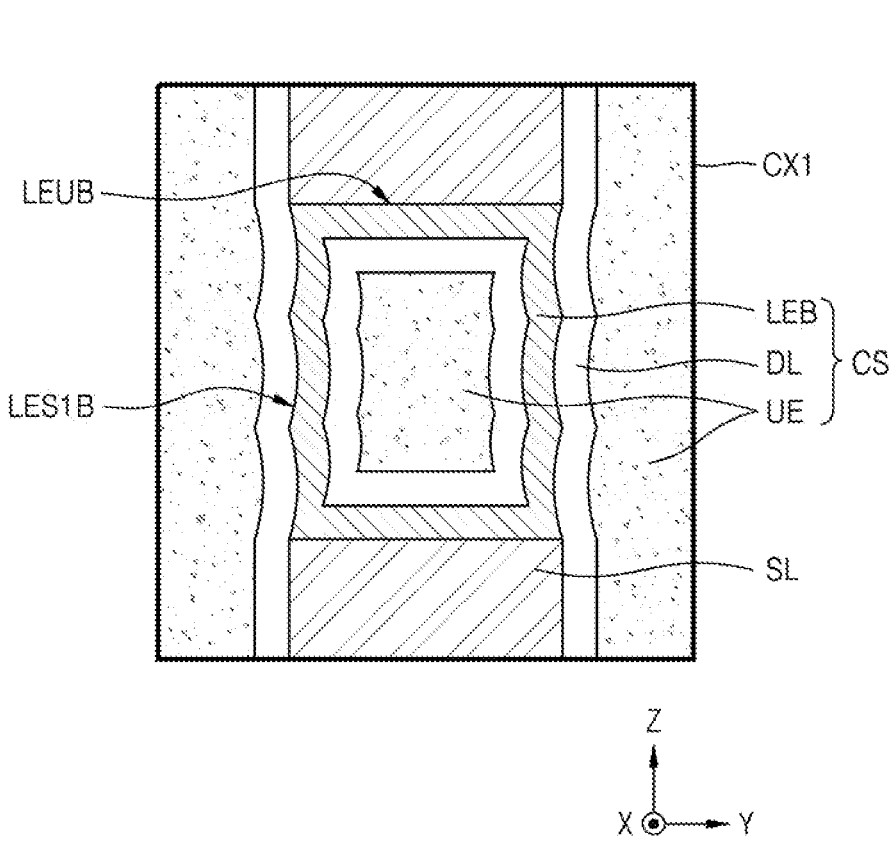
FIG. 10 is a cross-sectional view of a semiconductor memory device according to embodiments.

FIG. 10 is a cross-sectional view of a semiconductor memory device 100B according to embodiments. FIG. 10 is an enlarged view of a portion corresponding to the region CX1 of FIG. 3.

Referring to FIG. 10, a lower electrode LEB may have a top surface LEUB, and may have a pair of first sidewalls LES1B spaced apart from each other in a second horizontal direction Y. The top surface LEUB of the lower electrode LEB may be in contact with a support layer SL and may have a flat profile, e.g., without protrusions or recesses. The pair of first sidewalls LES1B may include a plurality of curved portions.

In an implementation, in order to form the lower electrode LEB, after performing the side recess process, the barrier metal layer 230 may be formed and the etching process may be performed to remove the barrier metal layer 230 from sidewalls of support layers SL. In the etching process, the barrier metal layer 230 may have concave sidewalls according to a thickness of the barrier metal layer 230 and an etching atmosphere. In this case, a side mold layer 250, which is formed on a sidewall of the barrier metal layer 230 and serves as a portion of a mold for the lower electrode LEB, may have a plurality of curved portions, and the first sidewalls LES1B of the lower electrode LEB on the side mold layer 250 may have a plurality of curved portions.

Figure 11:
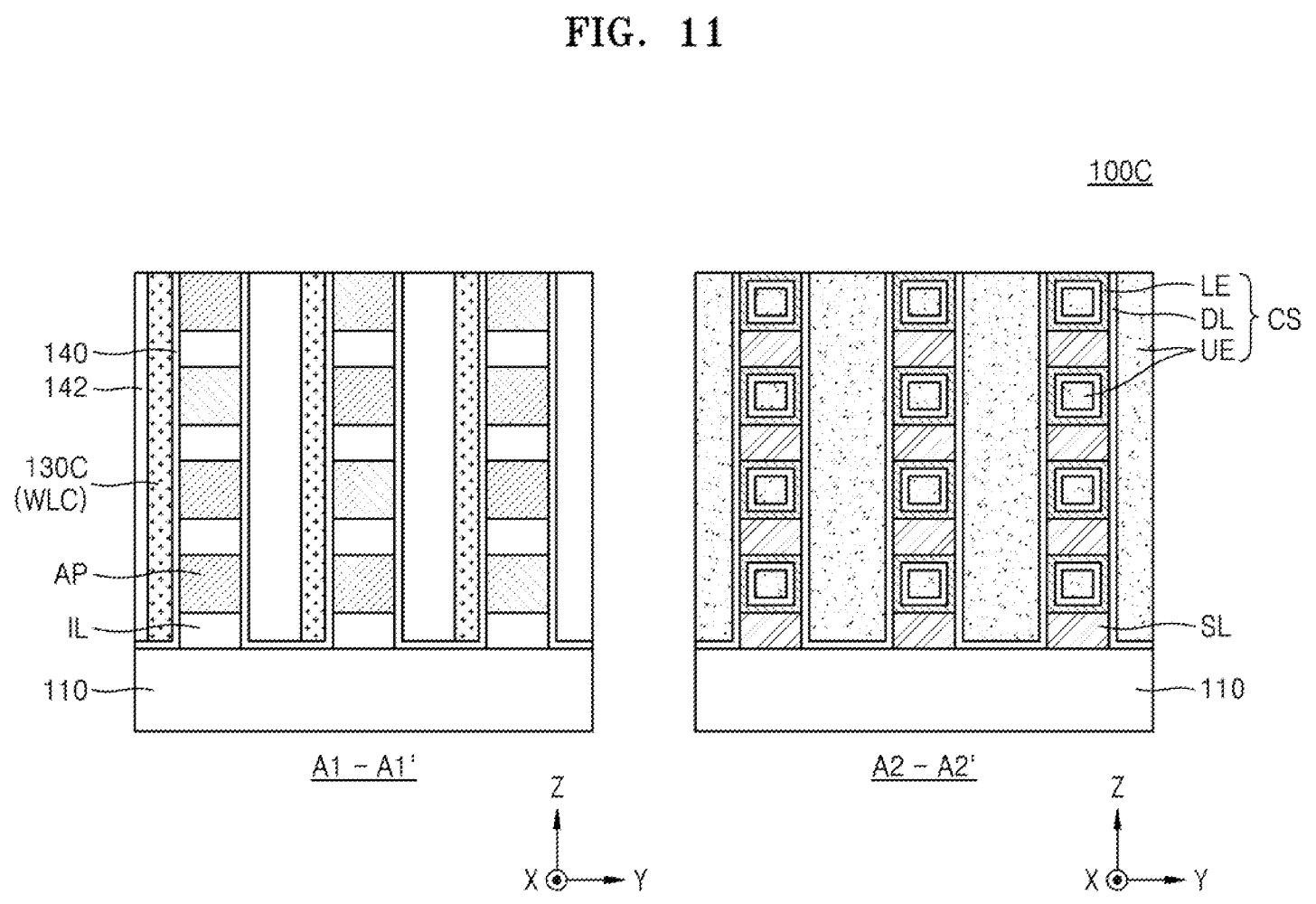

FIG. 11 is a cross-sectional view of a semiconductor memory device 100C according to embodiments. FIG. 11 illustrates cross-sectional views corresponding to cross-sections taken along lines A1-A1' and A2-A2' of FIG. 2.

Referring to FIG. 11, a word line WLC may include a first gate electrode 130C, and the first gate electrode 130C may extend on (e.g., only) one sidewall of a semiconductor pattern AP in the vertical direction Z. The word line WLC may not be on a sidewall of the semiconductor pattern AP opposite to the one sidewall. The semiconductor memory device 100C may have a single gate transistor structure.

Figure 12:
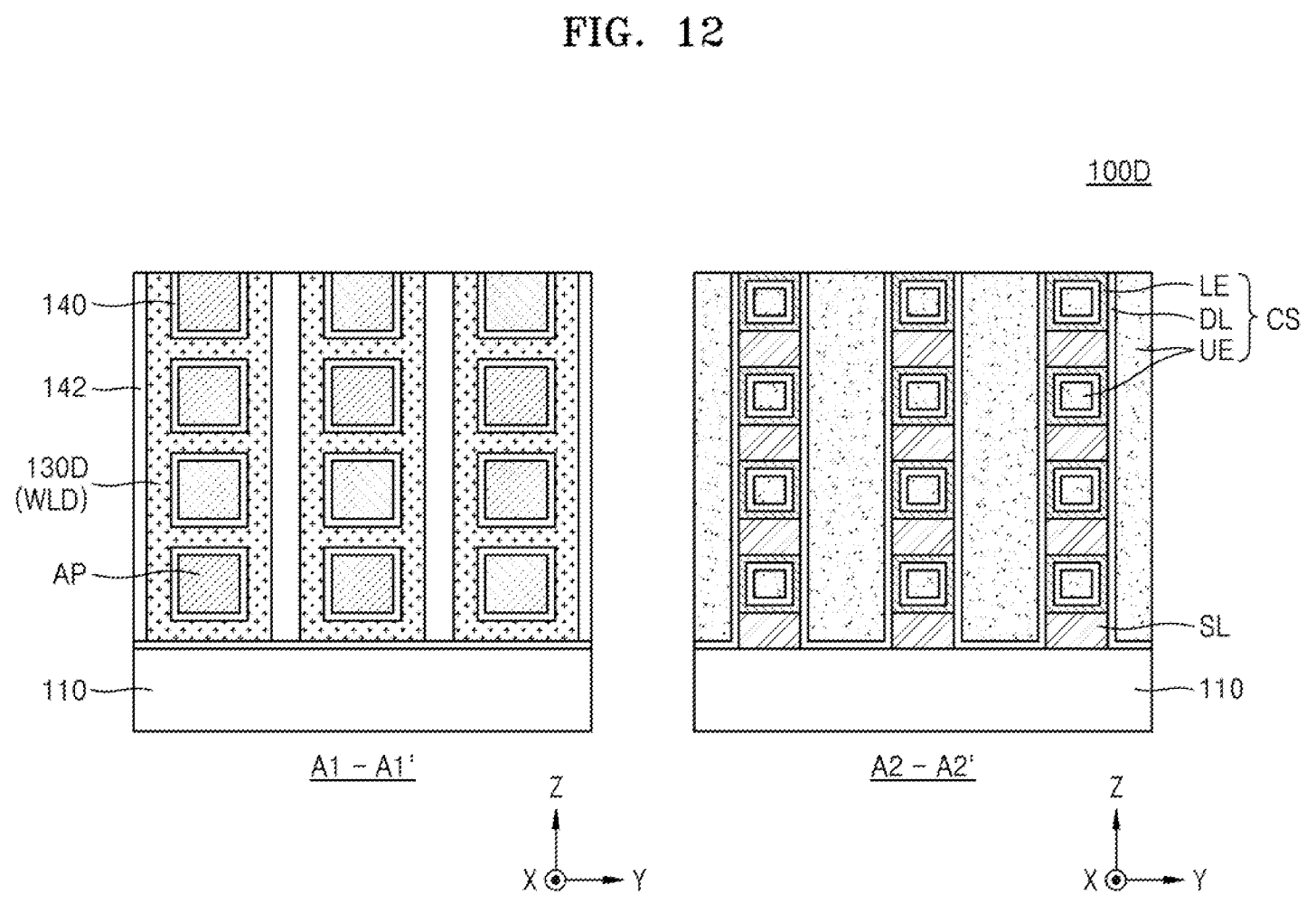

FIG. 12 is a cross-sectional view of a semiconductor memory device 100D according to embodiments.

Referring to FIG. 12, a word line WLD may include a first gate electrode 130D, and the first gate electrode 130D may surround all sidewalls of a semiconductor pattern AP, and extend in a vertical direction Z. A gate insulating layer 140 may be between the first gate electrode 130D and the semiconductor pattern AP. The semiconductor memory device 100D may have a gate-all-around type transistor structure.

Figure 22A:
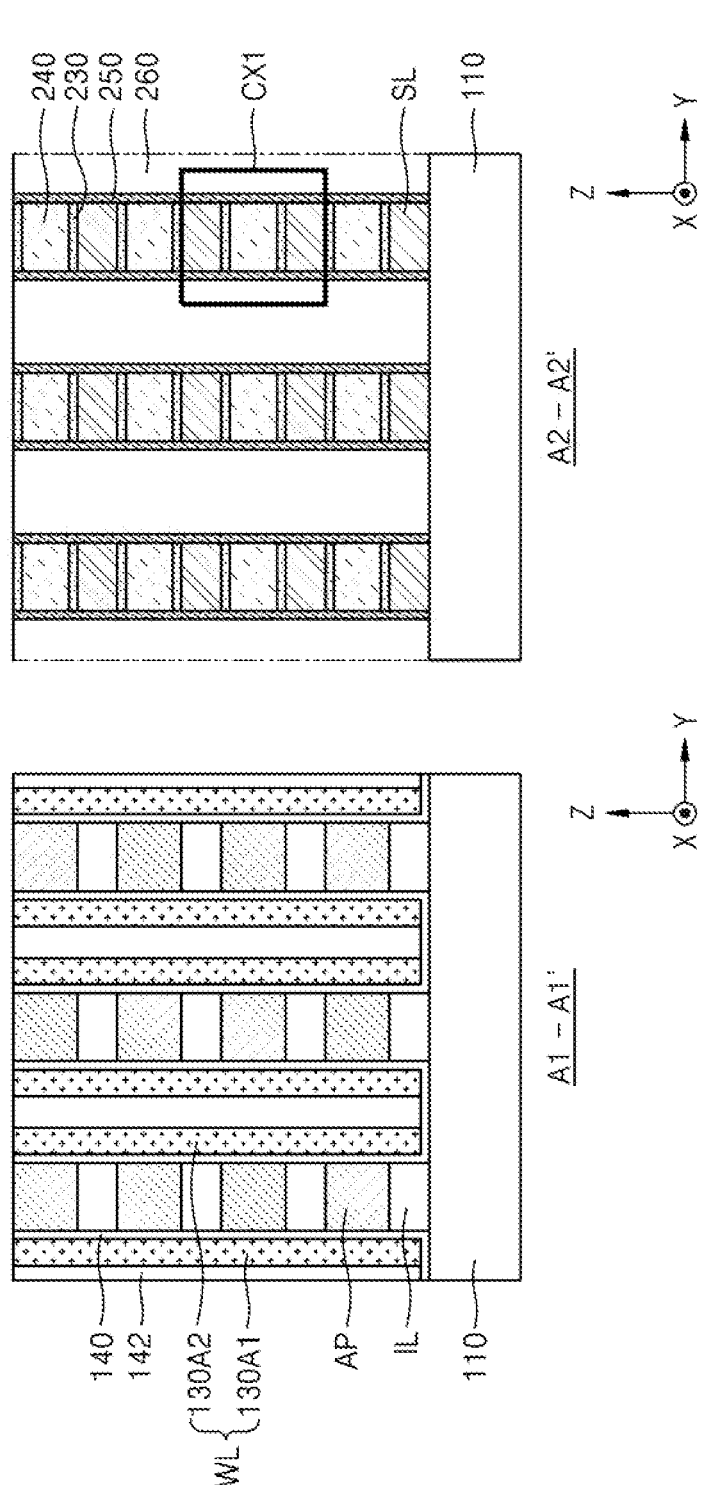
Figure 22B:
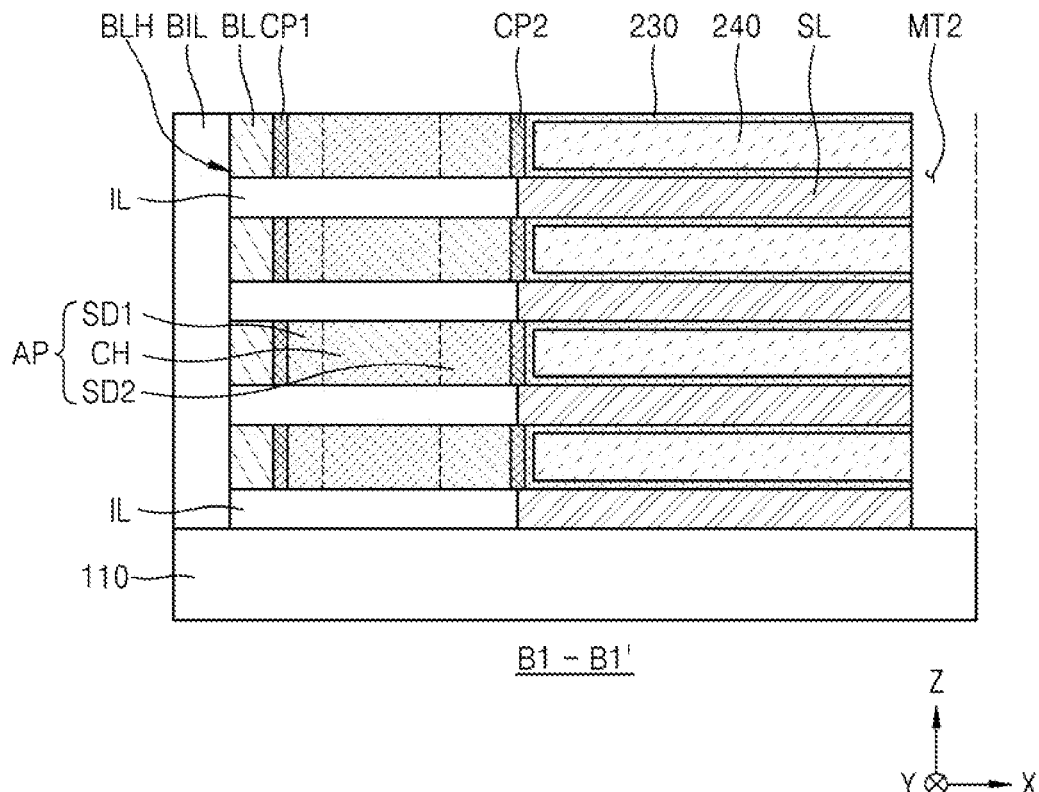
Figure 22C:
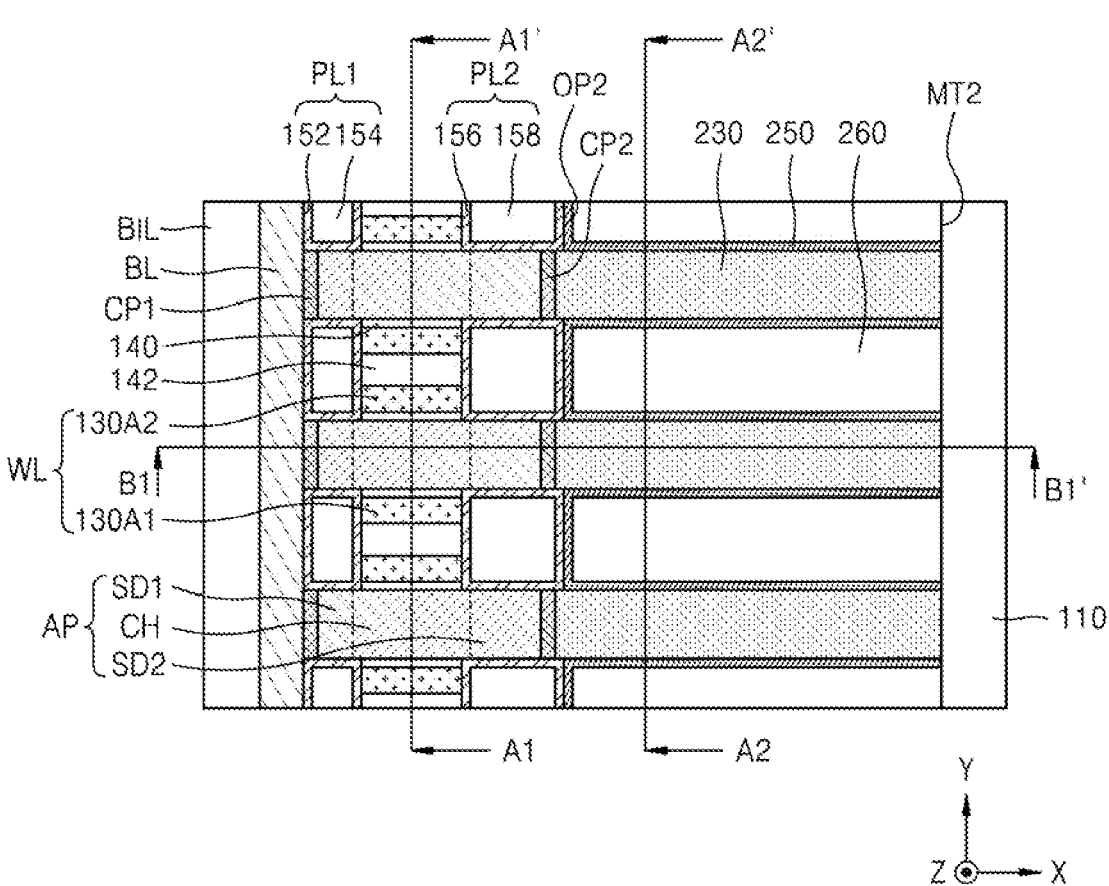
Figure 22D:
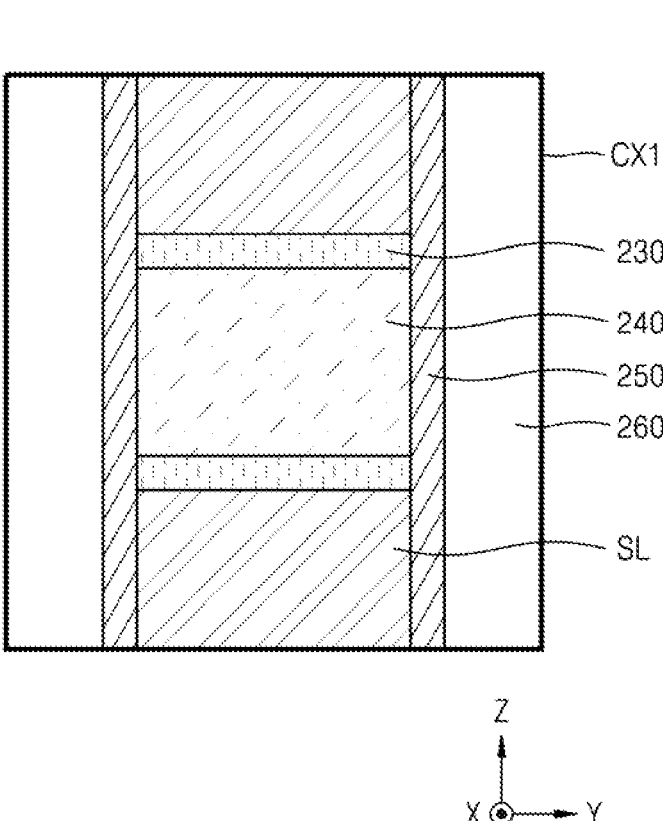
FIGS. 22D, 22E, and 22F are enlarged views of a region CX1 of FIG. 22A.
Figure 22E:
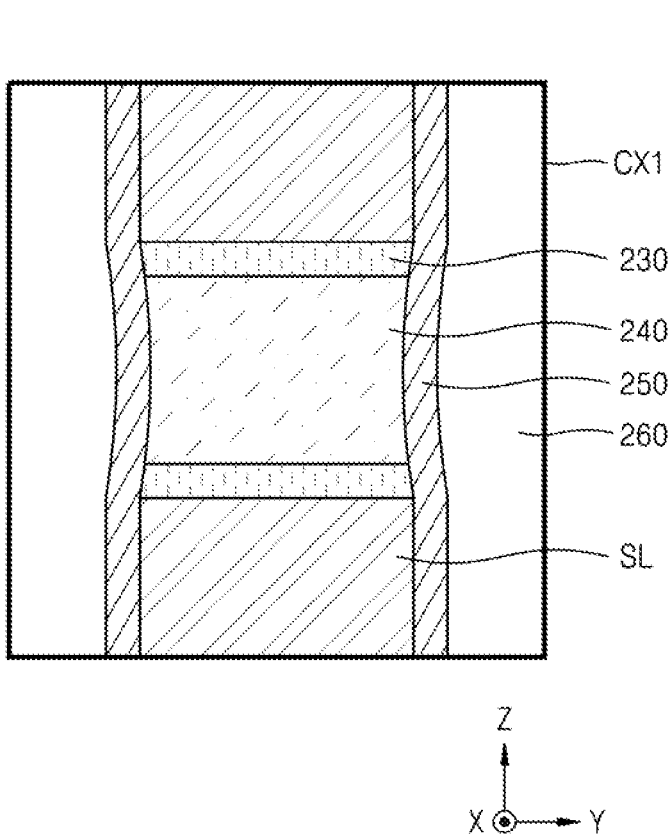
Figure 22F:
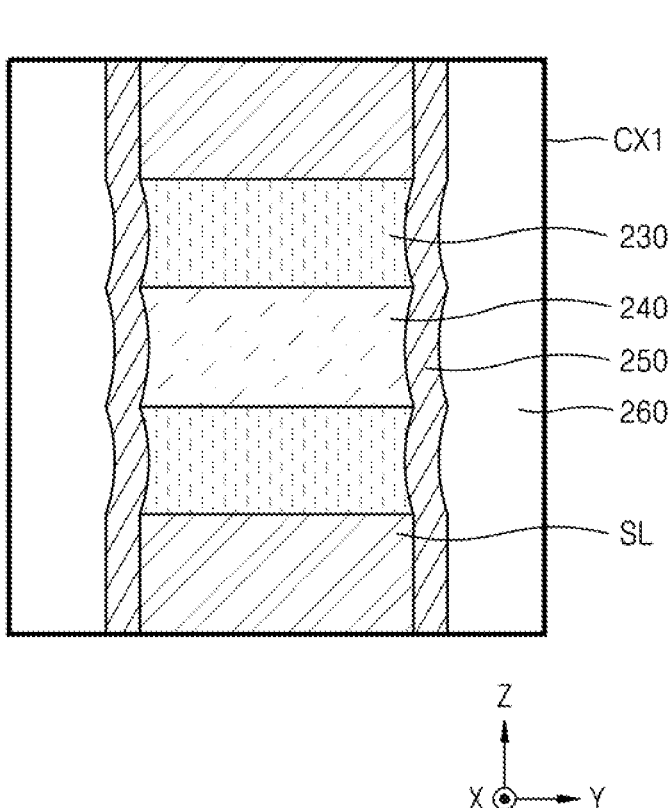

FIGS. 13 to 27B illustrate stages in a method of manufacturing a semiconductor memory device 100 according to embodiments. Specifically, FIGS. 13, 14A, 15A, 16A, 17A, 18A, 19A, 20A, 21, 22A, 23A, 24A, 25A, 26A, and 27A are cross-sectional views taken along lines A1-A1' and A2-A2' of FIG. 2. FIGS. 14B, 15B, 16B, 17B, 18B, 19B, 20B, 22B, 23B, 24B, 25B, 26B, and 27B are cross-sectional views taken along line B1-B1' of FIG. 2. FIGS. 14C, 15C, 18C, 19C, and 22C are top views of the semiconductor memory device 100. FIGS. 19D and 19E are enlarged views of a region CX2 of FIG. 19C. FIGS. 22D, 22E, and 22F are enlarged views of a region CX1 of FIG. 22A.

Figure 13:
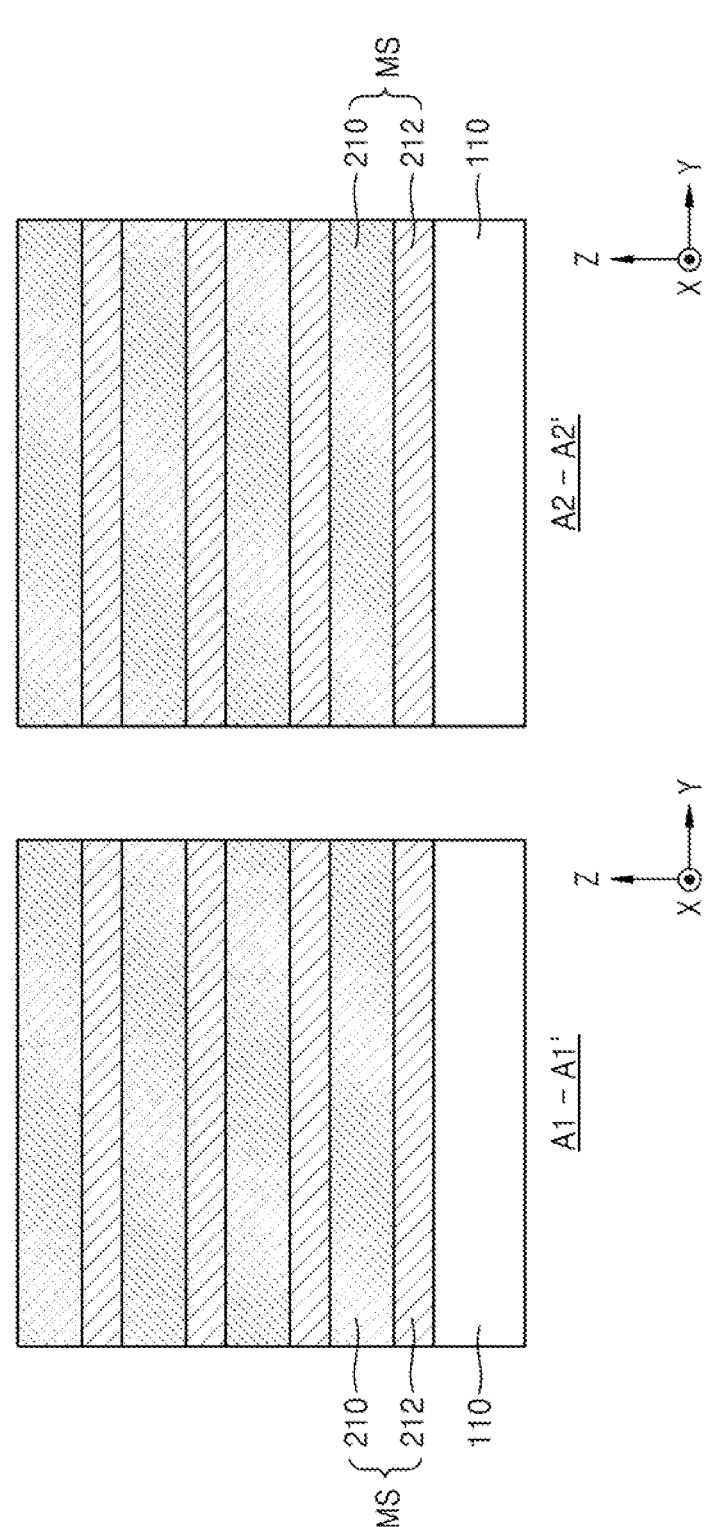

Referring to FIG. 13, a mold stack MS may be formed by alternately and sequentially forming a sacrificial mold layer 212 and a channel mold layer 210 on a substrate 110.

In an implementation, the channel mold layer 210 and the sacrificial mold layer 212 may be formed of materials having an etch selectivity with respect to each other. In an implementation, the channel mold layer 210 and the sacrificial mold layer 212 may be single crystal layers of a Group IV semiconductor, a Group IV-IV semiconductor, a Group II-VI compound semiconductor, or a Group III-V compound semiconductor, and may be formed of different materials. In an implementation, the sacrificial mold layer 212 may be formed of SiGe, and the channel mold layer 210 may be formed of single crystal silicon. Each of the channel mold layer 210 and the sacrificial mold layer 212 may have a thickness (e.g., in the vertical direction Z) of several tens of nm.

In an implementation, the channel mold layer 210 and the sacrificial mold layer 212 may be formed by an epitaxy process. In an implementation, the epitaxy process may be vapor-phase epitaxy (VPE), a chemical vapor deposition process such as ultra-high vacuum CVD (UHV-CVD), molecular beam epitaxy, or a combination thereof. In the epitaxy process, a liquid or gaseous precursor may be used as a precursor necessary to form the channel mold layer 210 and the sacrificial mold layer 212.

Figure 14A:
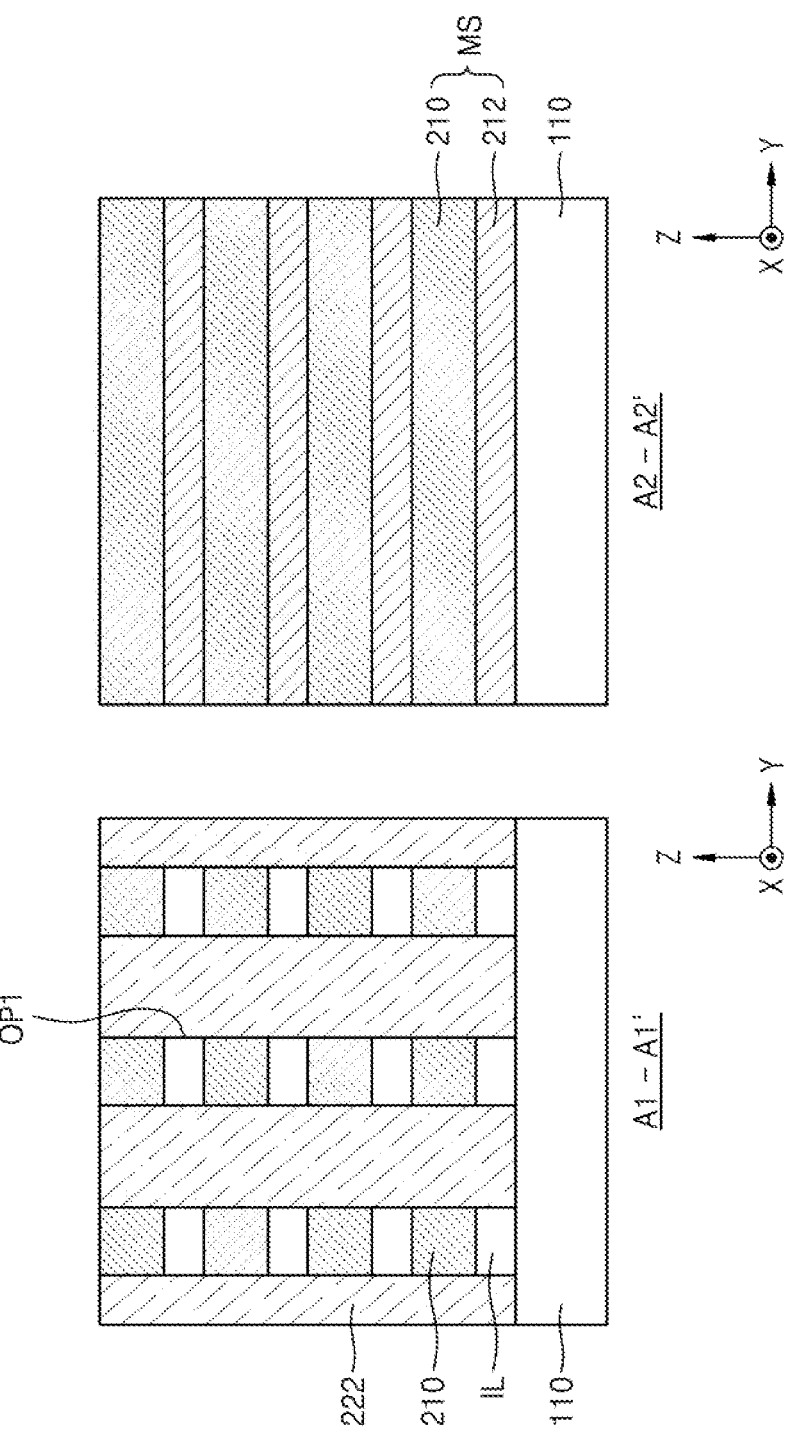
Figure 14B:
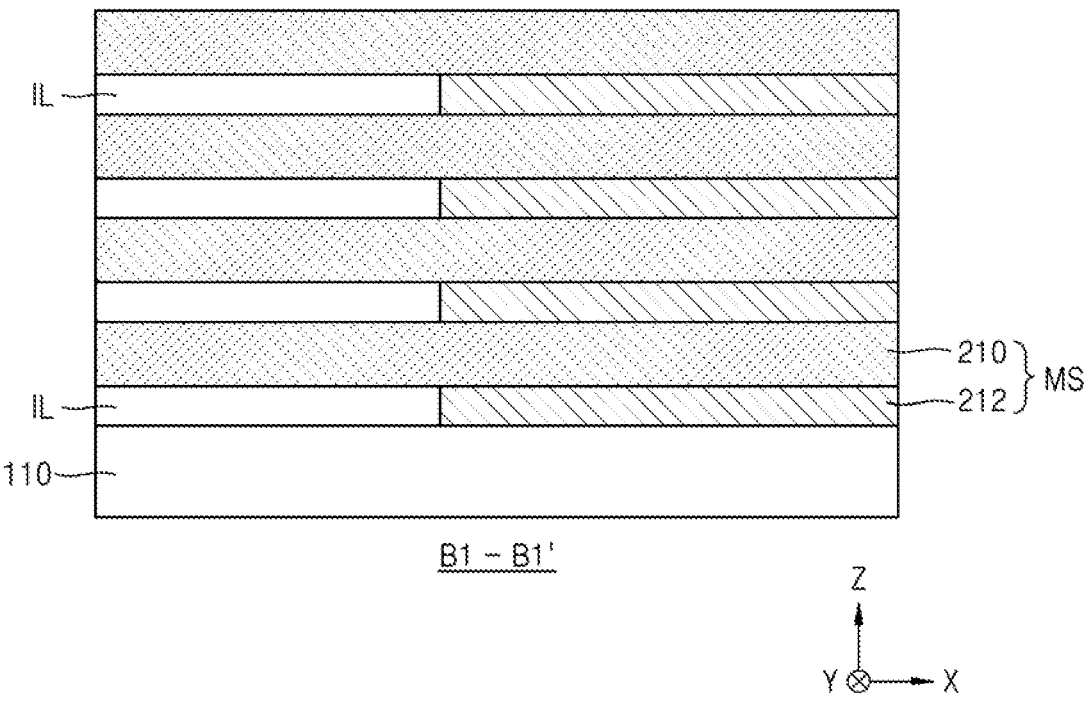
Figure 14C:
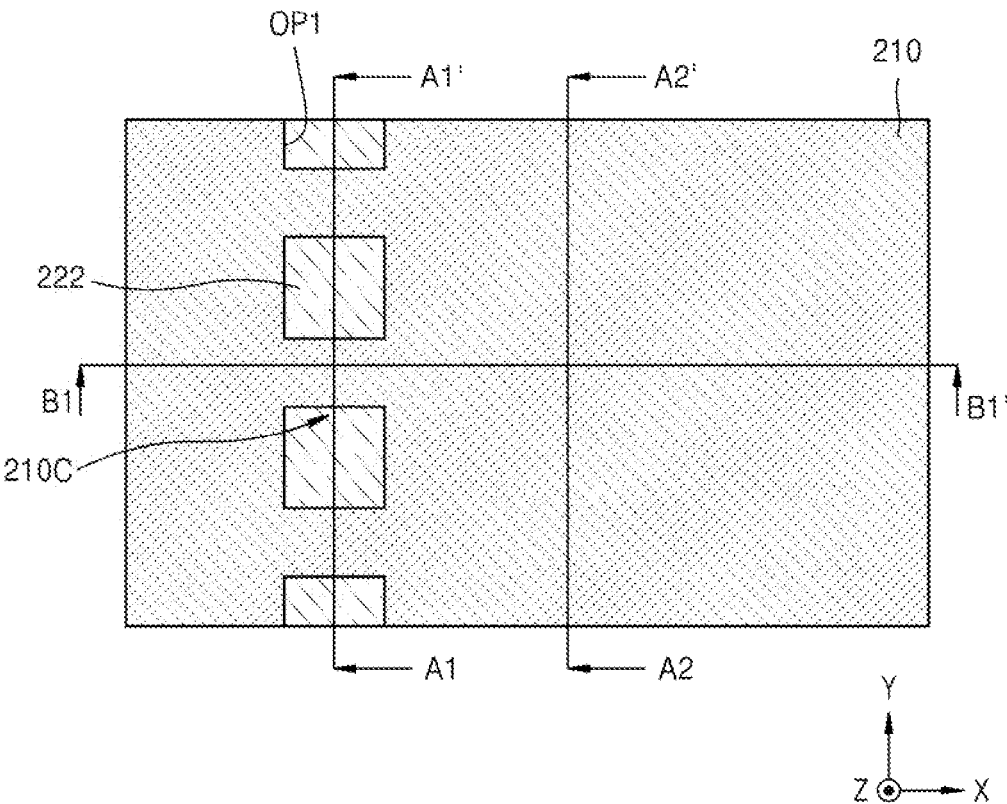
FIGS. 14C, 15C, 18C, 19C, and 22C are top views of a semiconductor memory device.

Referring to FIGS. 14A to 14C, a mask pattern may be formed on the mold stack MS, and a portion of the mold stack MS may be removed using the mask pattern as an etching mask to form first openings OP1. Sidewalls 210C of a portion of the channel mold layer 210 corresponding to a channel region CH of a semiconductor pattern AP may be formed by the first openings OP1.

Thereafter, the sacrificial mold layer 212 exposed through the first openings OP1 may be removed, and a mold insulating layer IL may be formed in a region from which the sacrificial mold layer 212 is removed. In an implementation, the mold insulating layer IL may be formed using at least one of silicon nitride, silicon oxide, and silicon oxynitride.

Thereafter, an insulating layer filling the inside of the first openings OP1 may be formed on the mold stack MS, and a first gap-fill insulating layer 222 may be formed by removing an upper portion of the insulating layer so that a top surface of the mold stack MS is exposed.

Figure 15A:
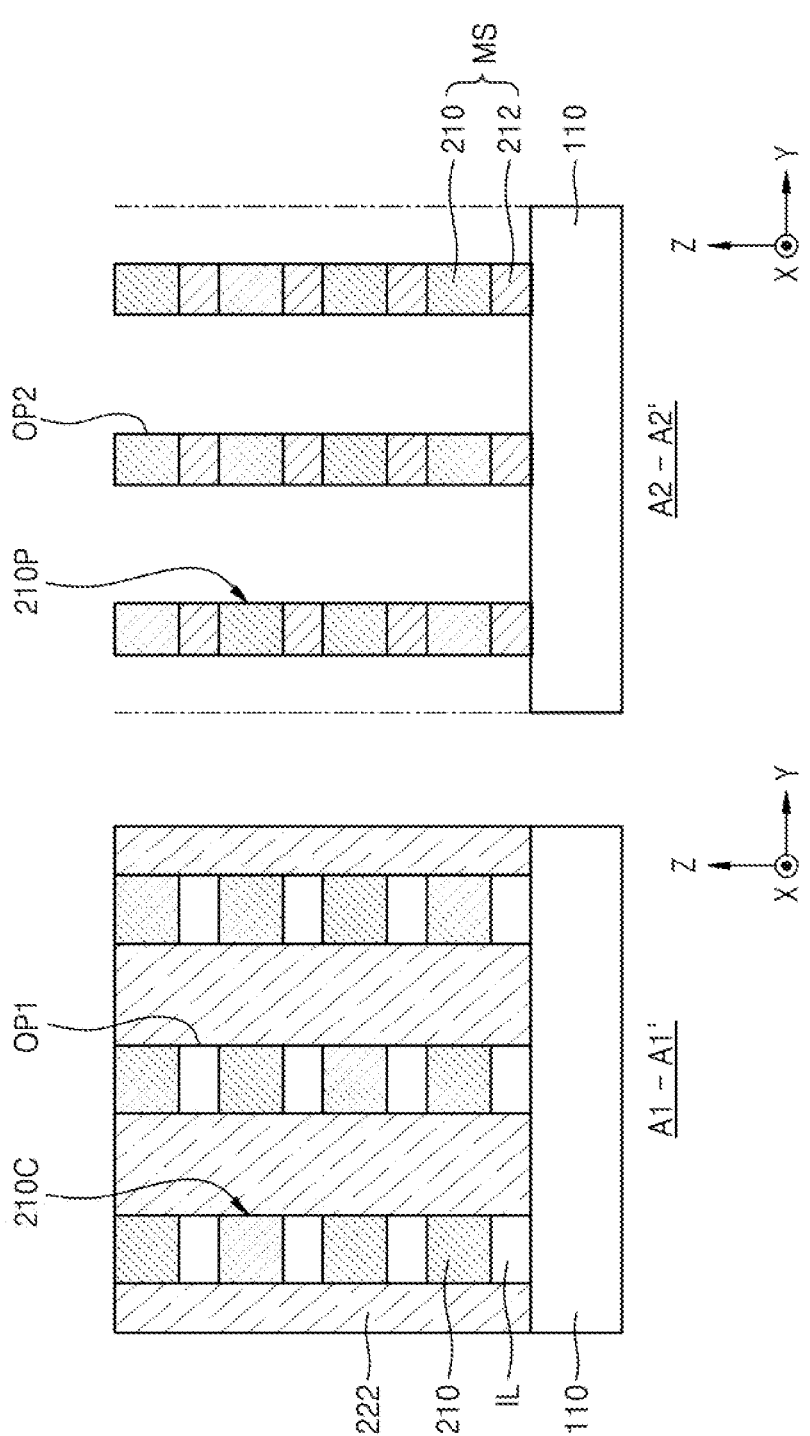
Figure 15B:
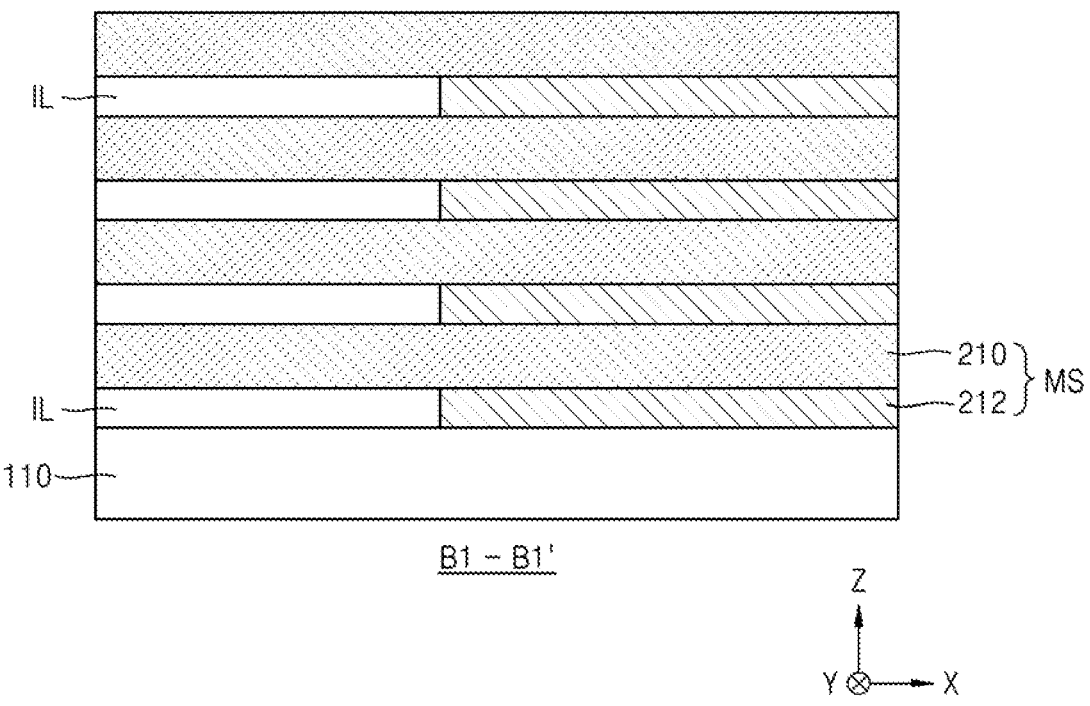
Figure 15C:
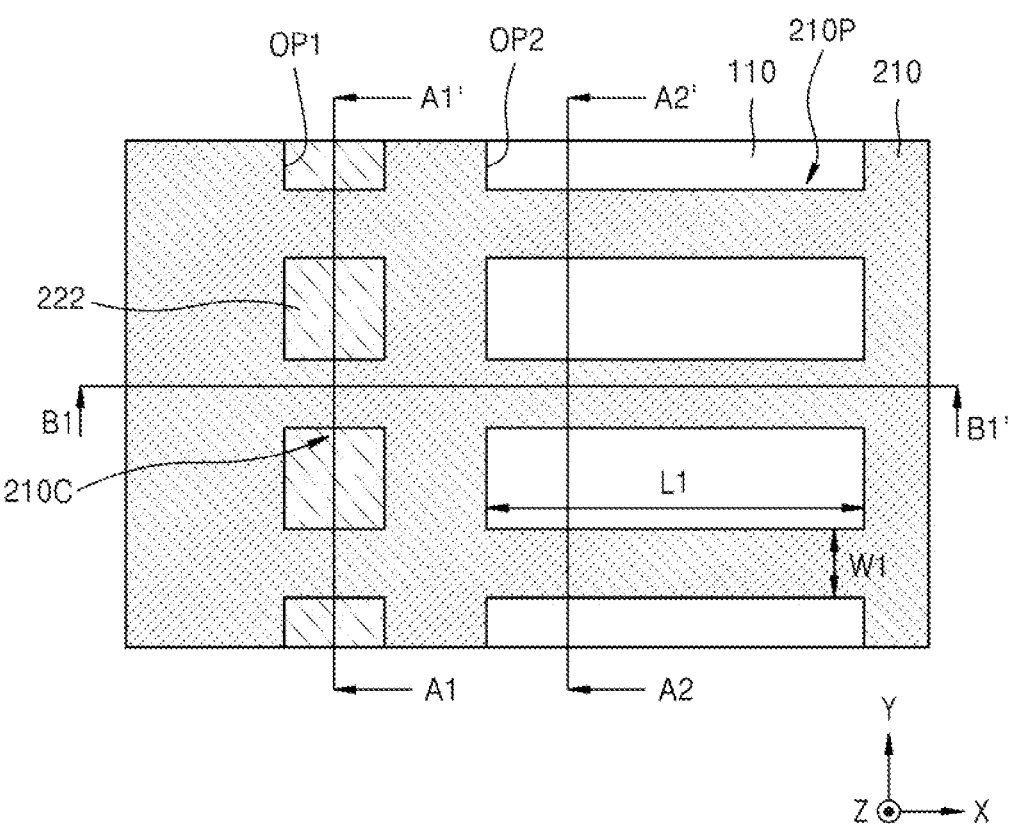

Referring to FIGS. 15A to 15C, a mask pattern may be formed on the mold stack MS, and portions of the mold stack MS may be removed using the mask pattern as an etching mask to form second openings OP2.

Portions of the channel mold layer 210, the sidewalls of which are defined by two adjacent second openings OP2, may be referred to as a lower-electrode sacrificial pattern 210P. Each of a plurality of lower-electrode sacrificial patterns 210P may be portions of the channel mold layer 210 that are replaced with lower electrodes LE in a subsequent process.

In an implementation, the plurality of lower-electrode sacrificial patterns 210P may extend in a first horizontal direction X and be spaced apart from each other in the second horizontal direction Y and the vertical direction Z. The plurality of lower-electrode sacrificial patterns 210P may have a first length L1 of about 50 nm to about 2,000 nm in the first horizontal direction X. The plurality of lower-electrode sacrificial patterns 210P may have a first width W1 of about 5 nm to about 100 nm in the second horizontal direction Y. Here, the first horizontal direction X may be referred to as a longitudinal direction of the lower-electrode sacrificial pattern 210P or the lower electrode LE, and an aspect ratio in the longitudinal direction (e.g., a ratio of the first length L1 in the first horizontal direction X to the first width W1 in the second horizontal direction Y) may be about 5 to about 400.

Figure 16A:
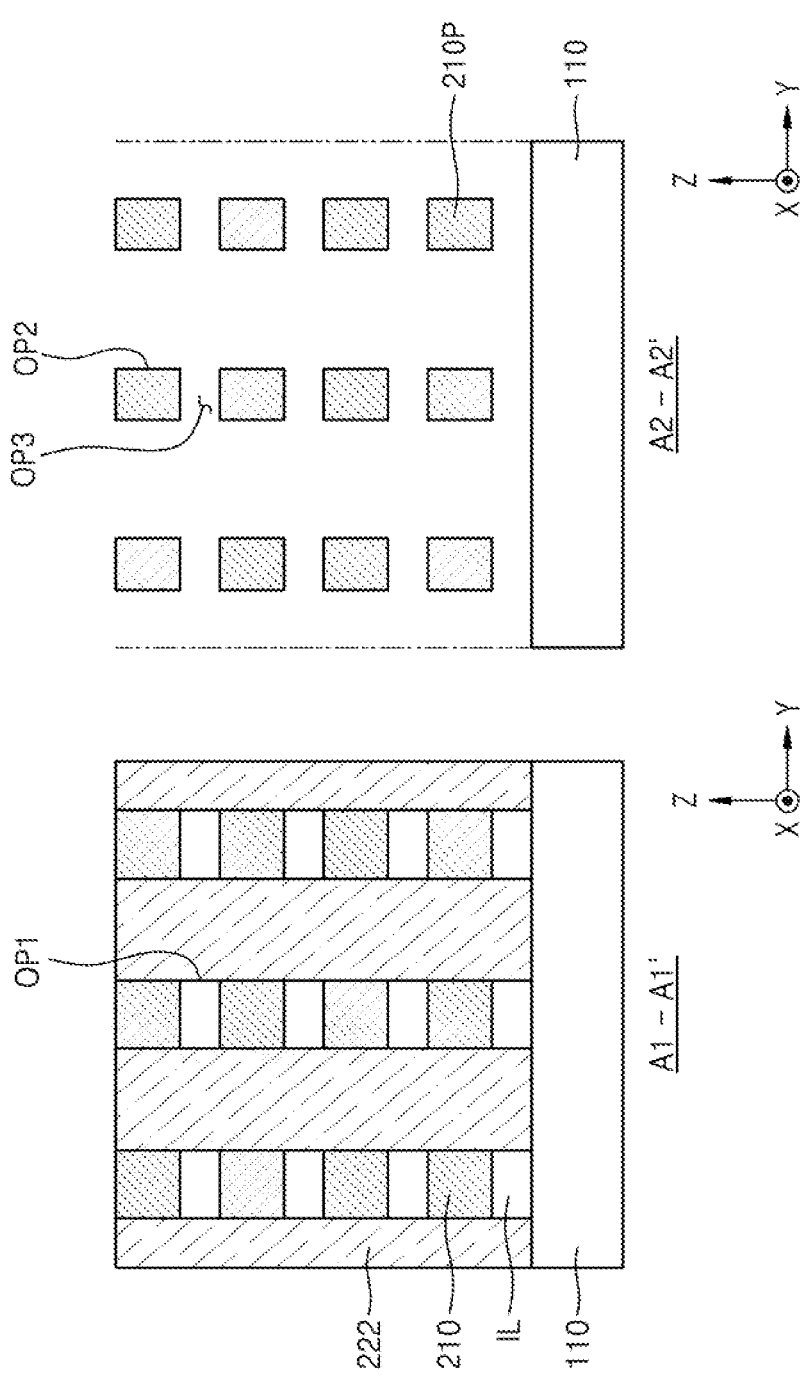
Figure 16B:
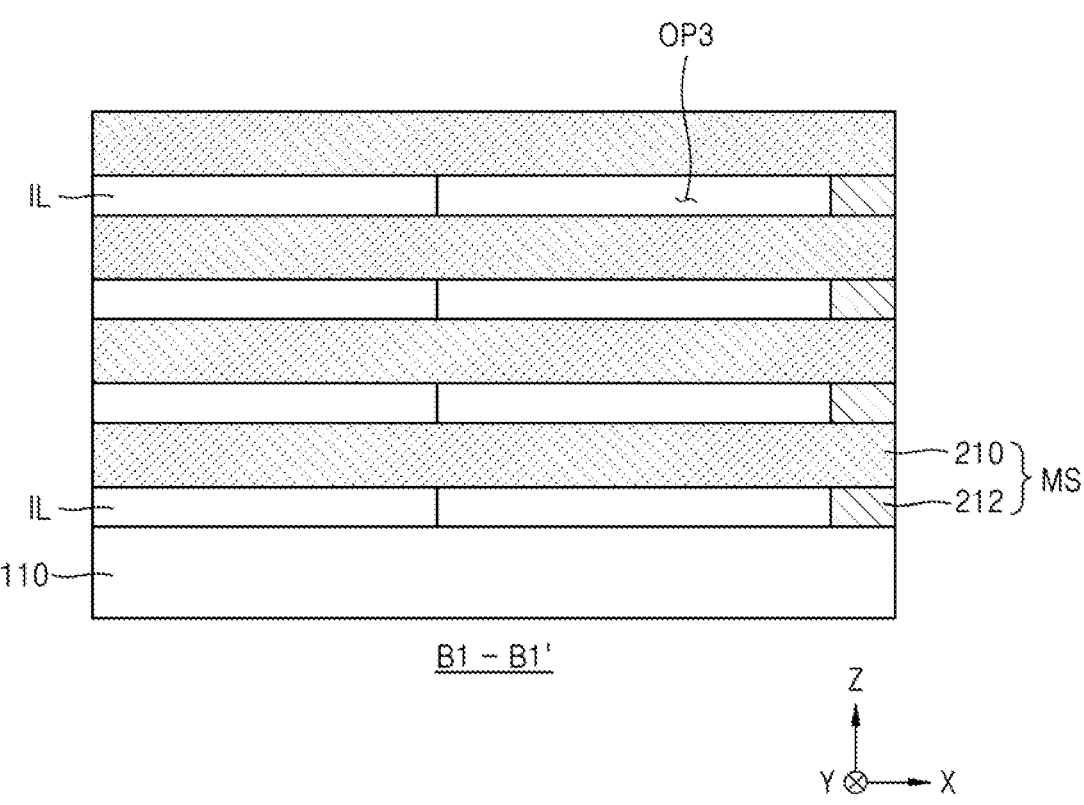

Referring to FIGS. 16A and 16B, third openings OP3 may be formed by removing the sacrificial mold layer 212 exposed through the second openings OP2. Accordingly, top and bottom surfaces of the plurality of lower-electrode sacrificial patterns 210P may be exposed through the third openings OP3.

FIG. 16B illustrates an example in which sidewalls of the mold insulating layer IL are exposed through the third openings OP3. In an implementation, in the process of removing the sacrificial mold layer 212 to form the third openings OP3, a portion of the sacrificial mold layer 212 adjacent to the mold insulating layer IL may not be removed. In this case, the portion of the sacrificial mold layer 212 adjacent to the mold insulating layer IL may remain, covering a sidewall of the mold insulating layer IL, and the mold insulating layer IL may not be exposed through the third openings OP3.

Figure 17A:
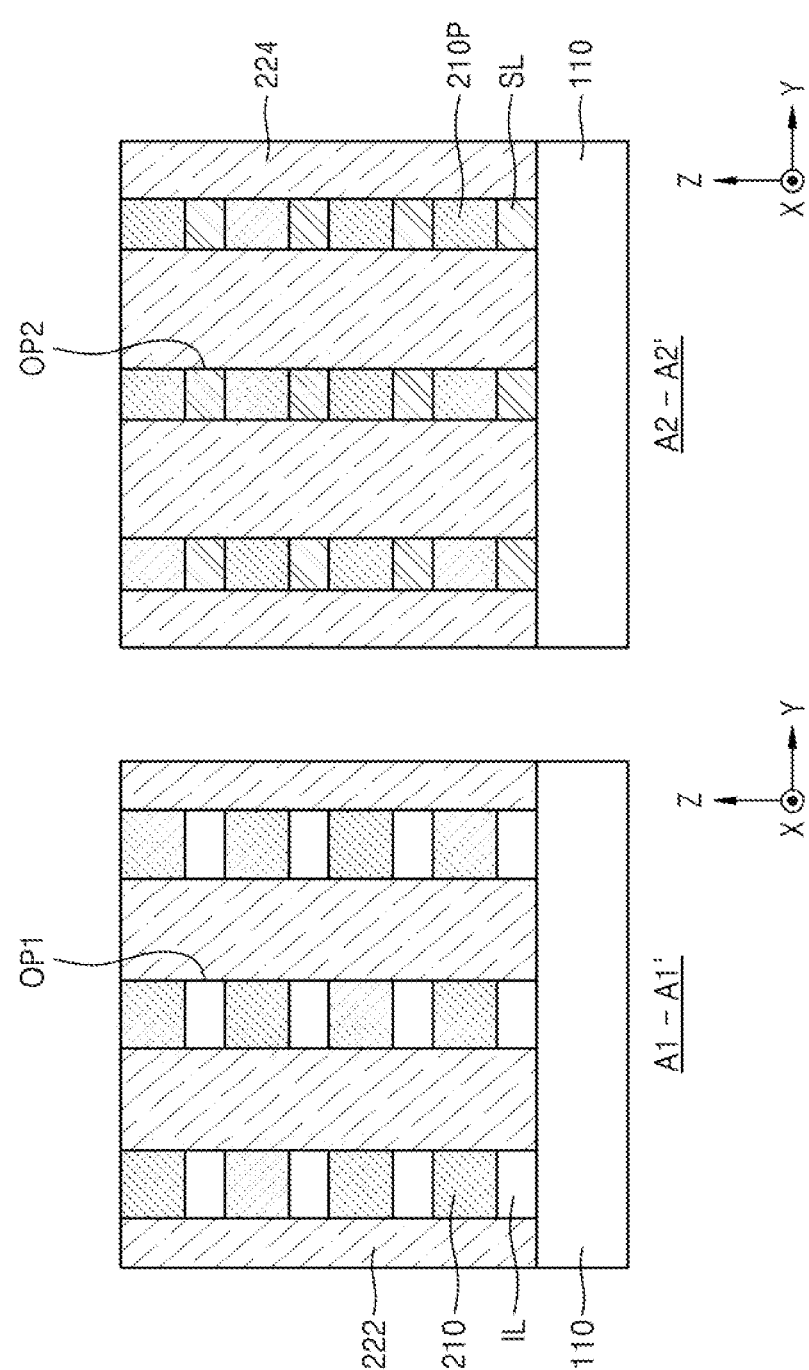
Figure 17B:
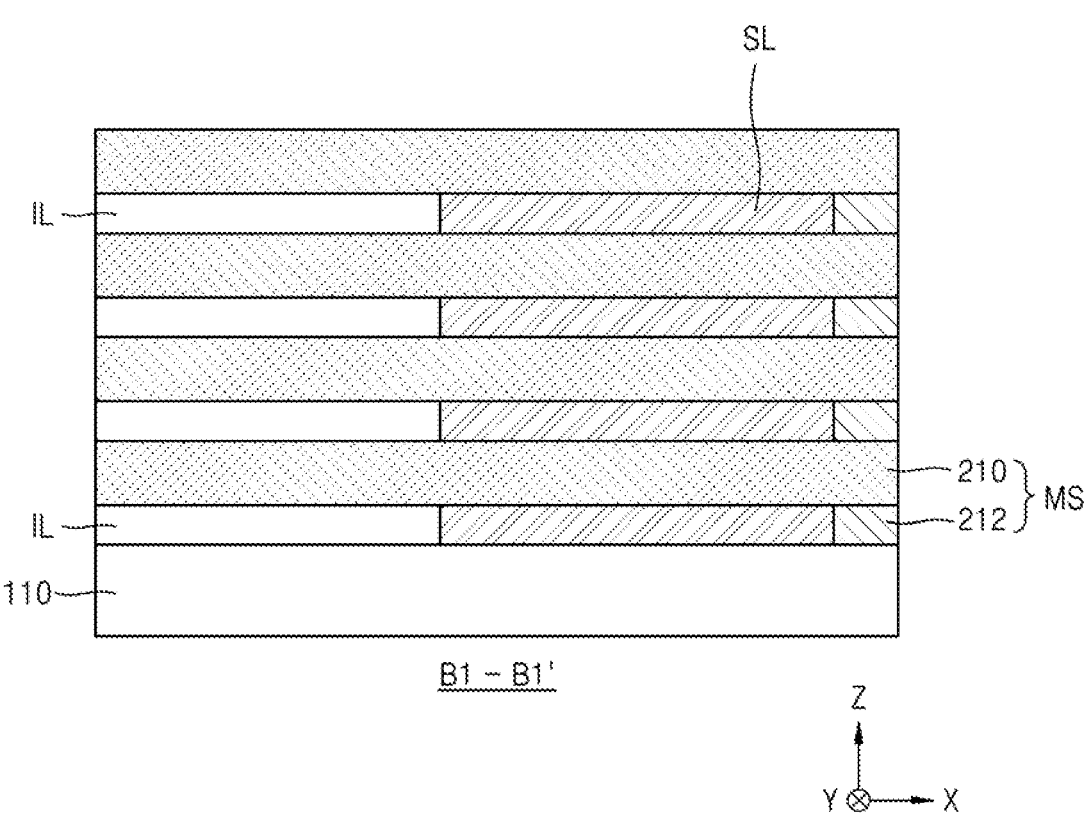

Referring to FIGS. 17A and 17B, an insulating layer may be formed on the mold stack MS to fill the inside of the third openings OP3, and an anisotropic etching process may be performed on the insulating layer to form a support layer SL. The support layer SL may be formed of, e.g., silicon nitride.

Sidewalls of the support layer SL may be aligned with the sidewalls of the plurality of lower-electrode sacrificial patterns 210P. A plurality of lower-electrode sacrificial patterns 210P and a plurality of support layers SL may be alternately arranged in the vertical direction Z.

Thereafter, an insulating layer filling the inside of the second openings OP2 may be formed on the mold stack MS, and an upper portion of the insulating layer may be removed so that the top surface of the mold stack MS is exposed, thereby forming a second gap-fill insulating layer 224.

Figure 18A:
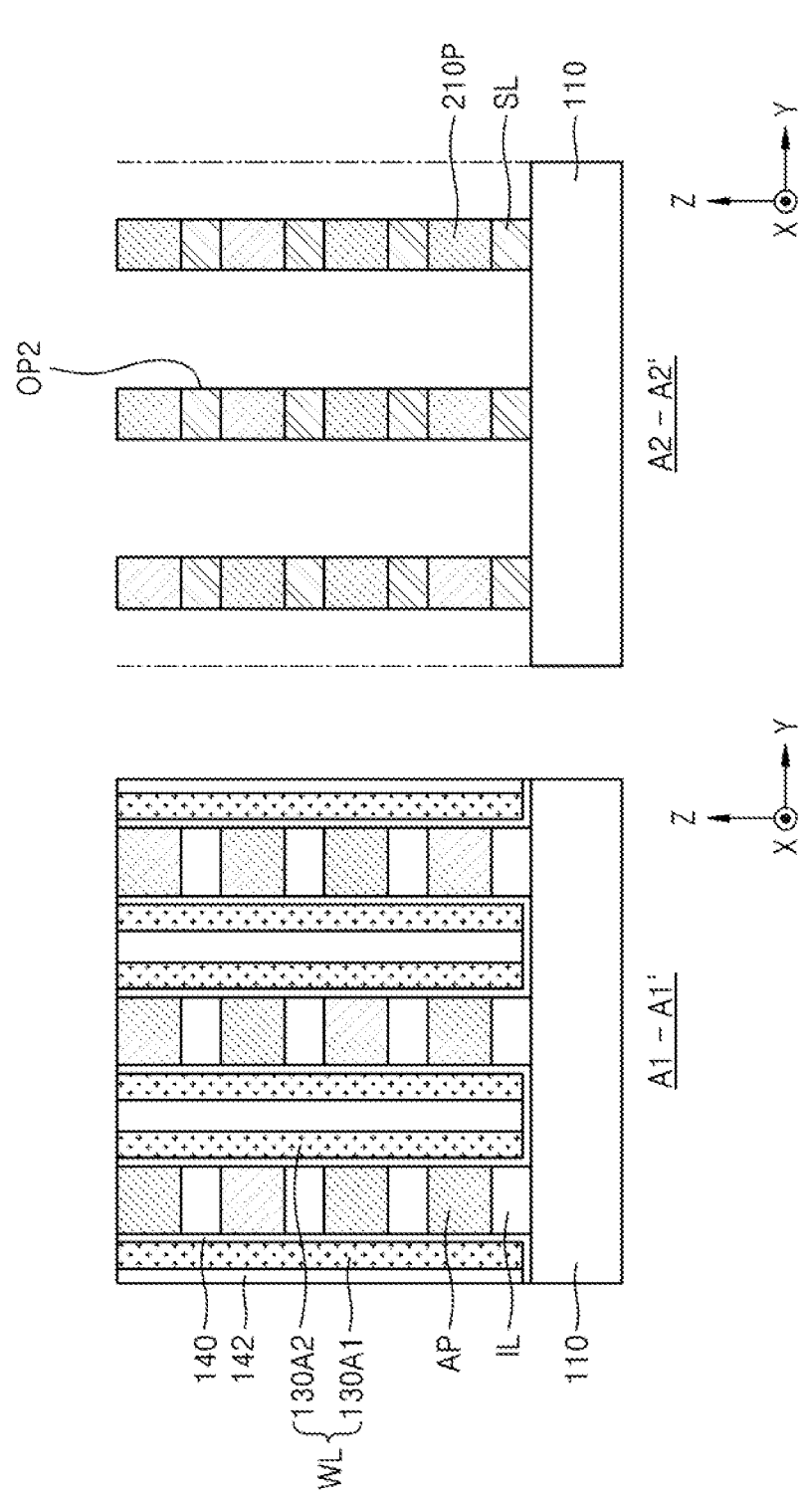
Figure 18B:
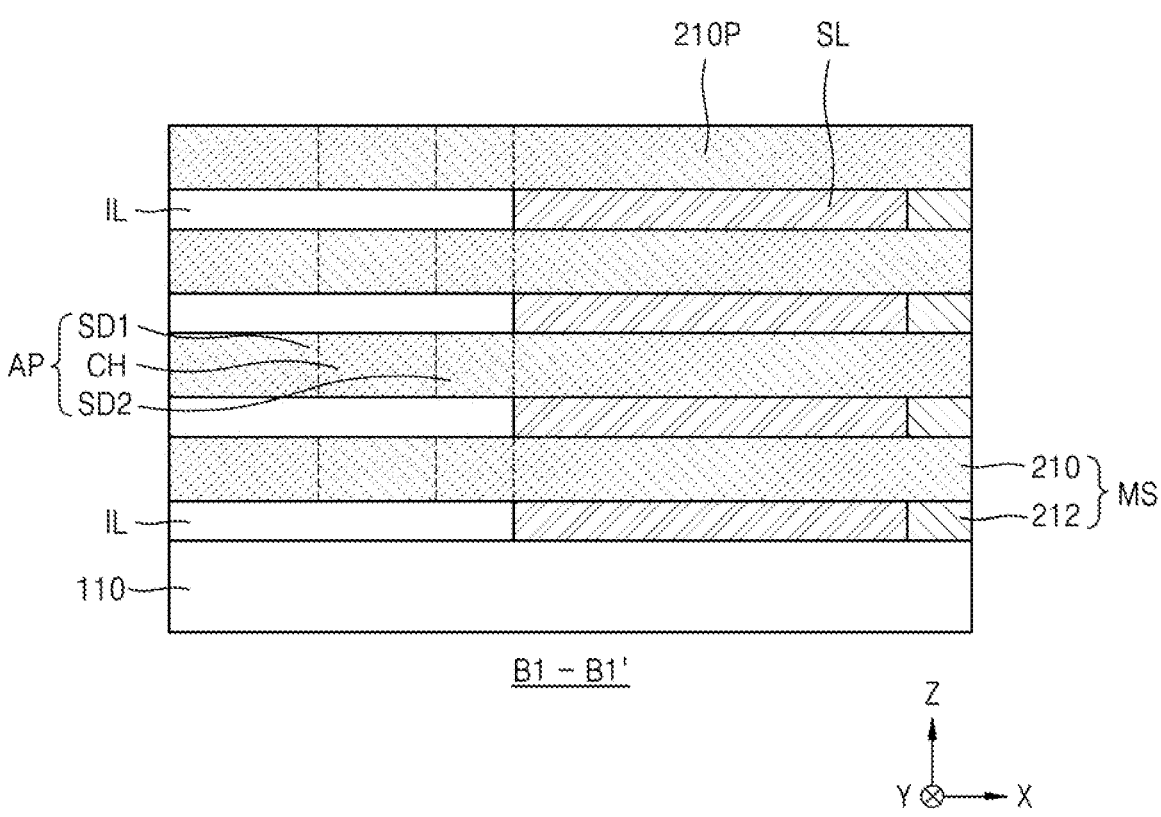
Figure 18C:
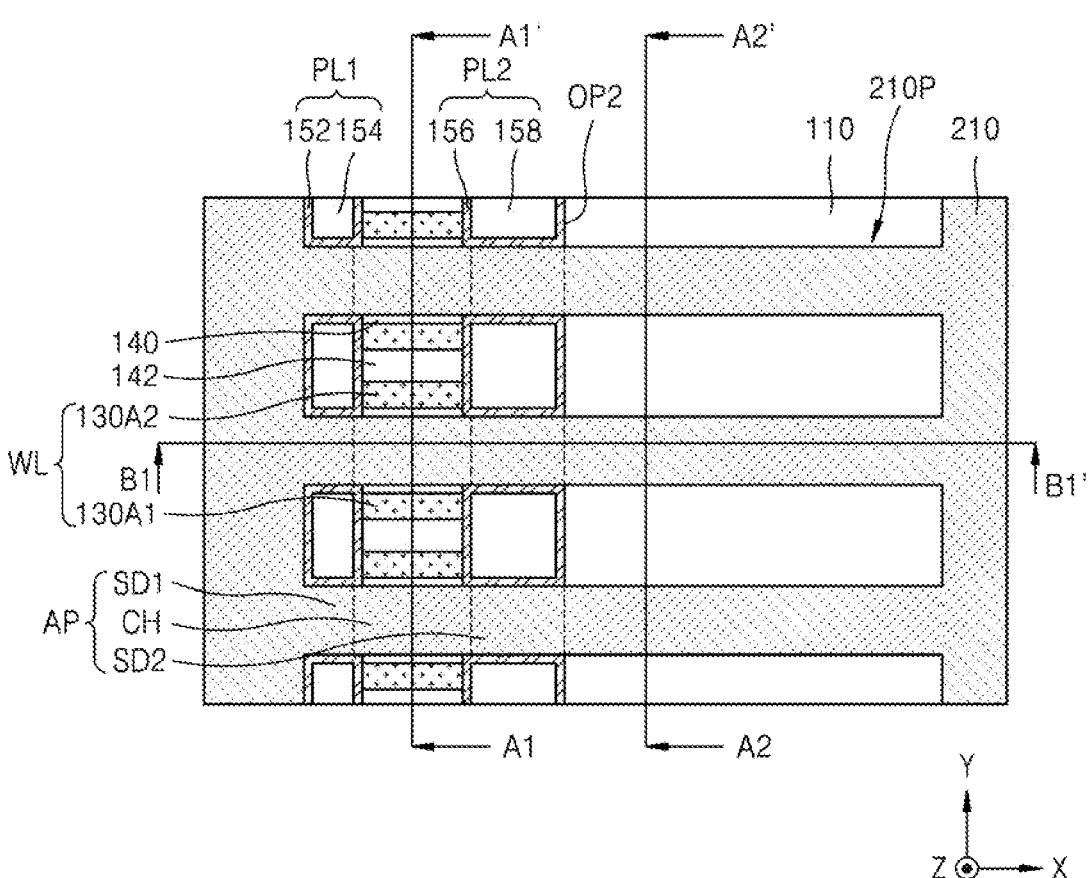
Figure 19A:
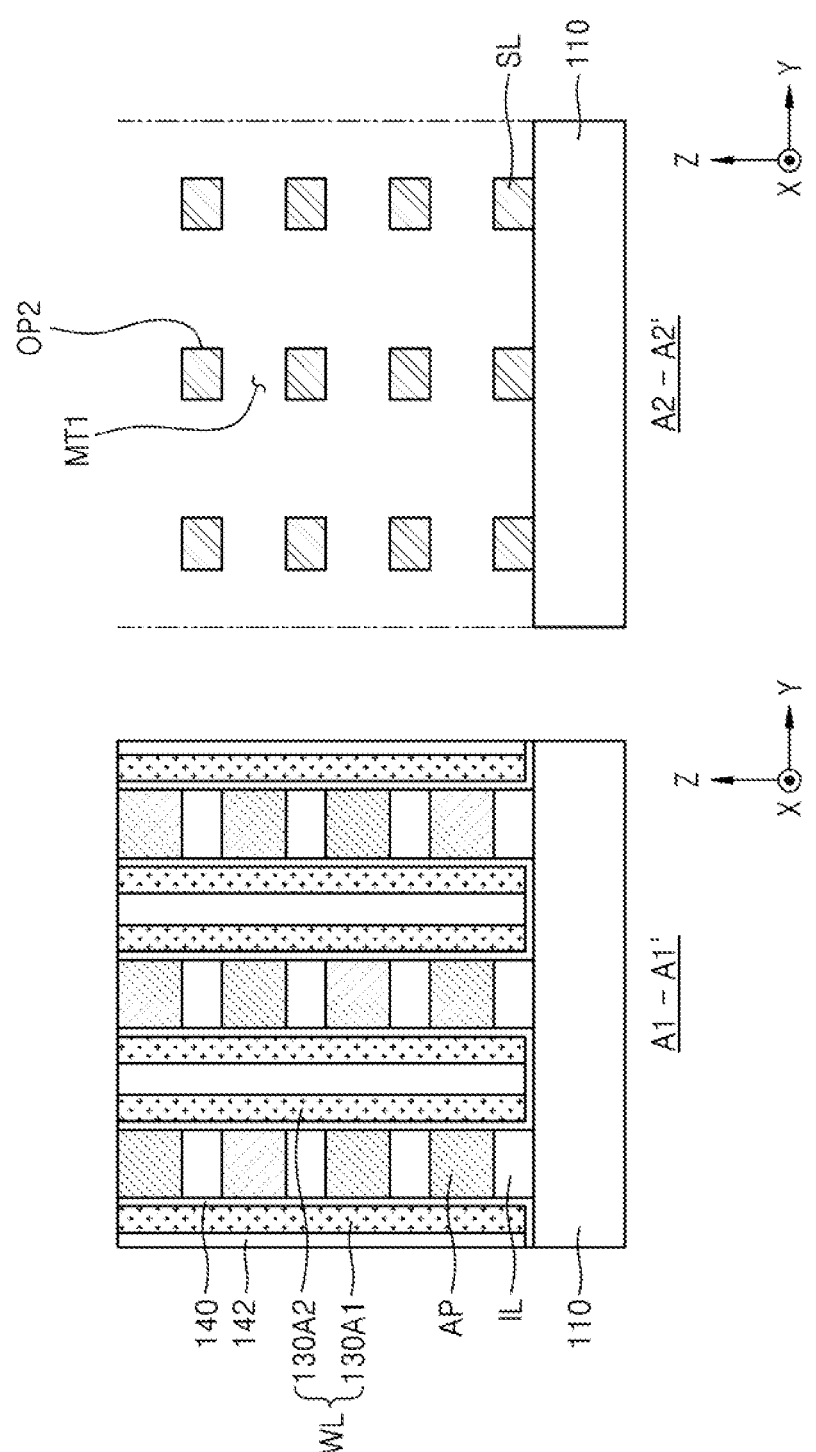
Figure 19B:
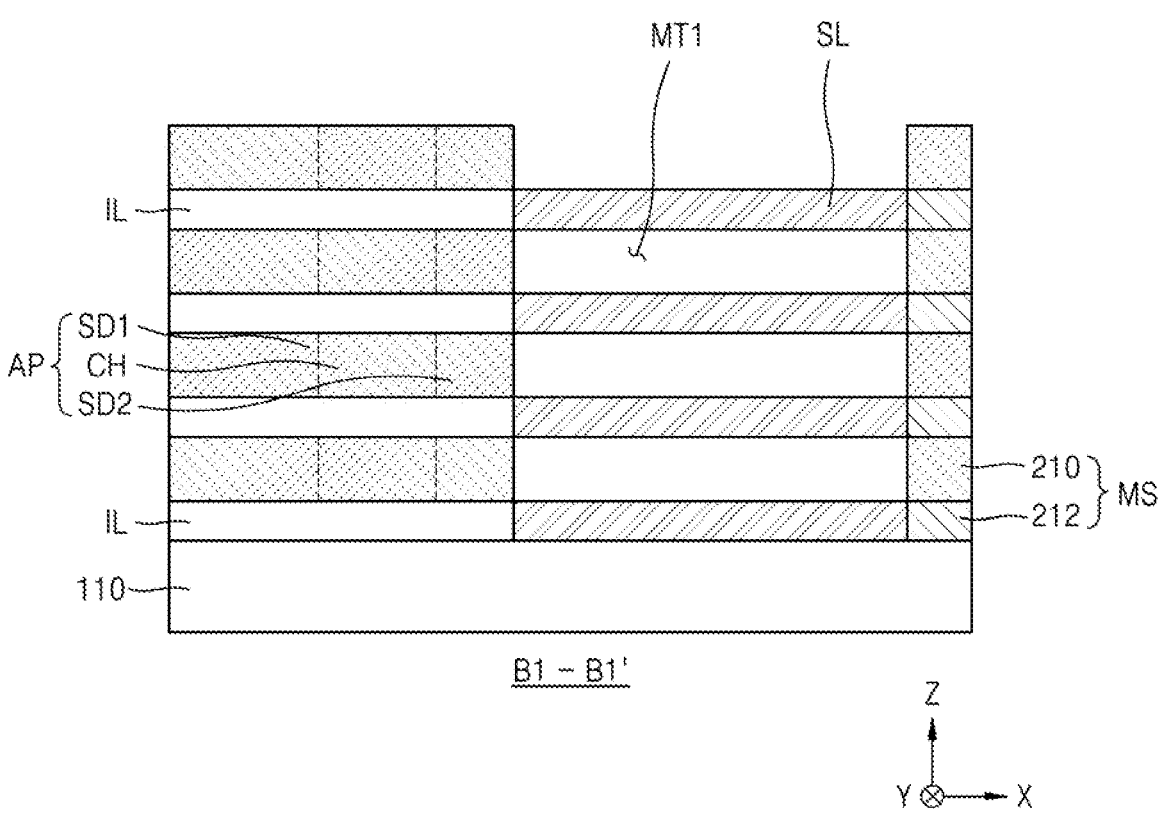
Figure 19C:
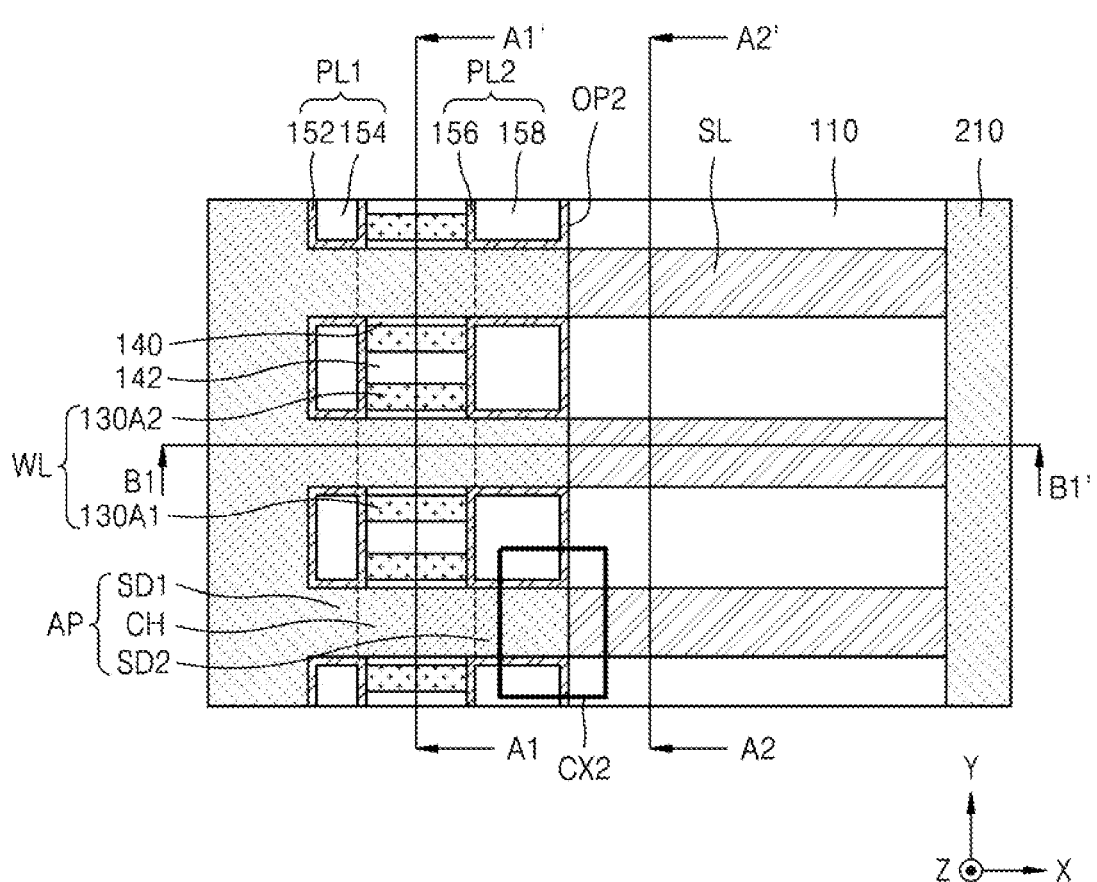
Figure 19D:
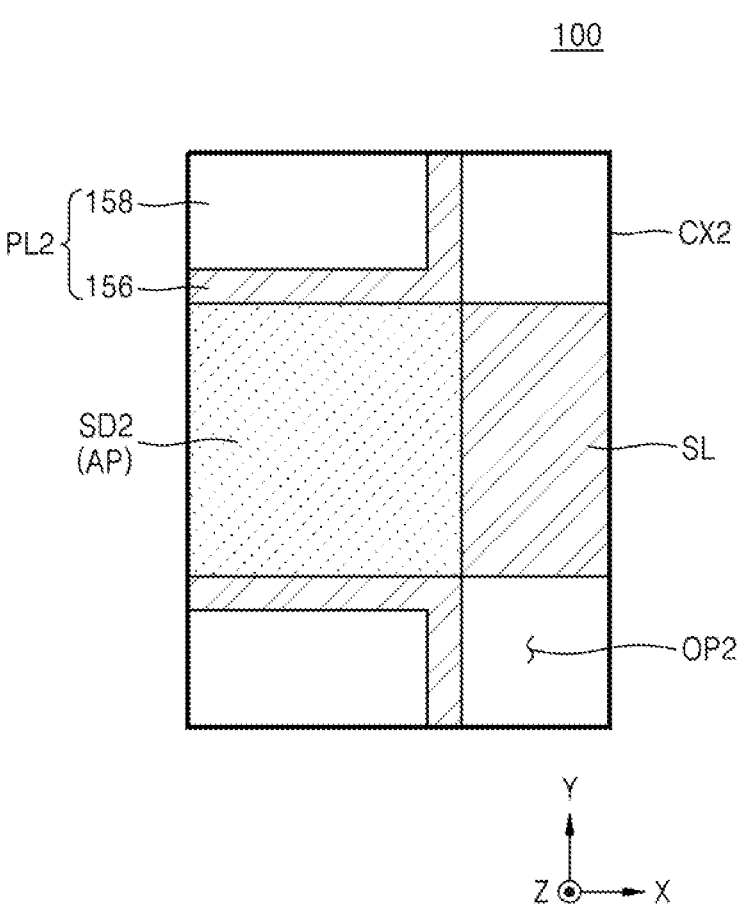
FIGS. 19D and 19E are enlarged views of a region CX2 of FIG. 19C.
Figure 19E:
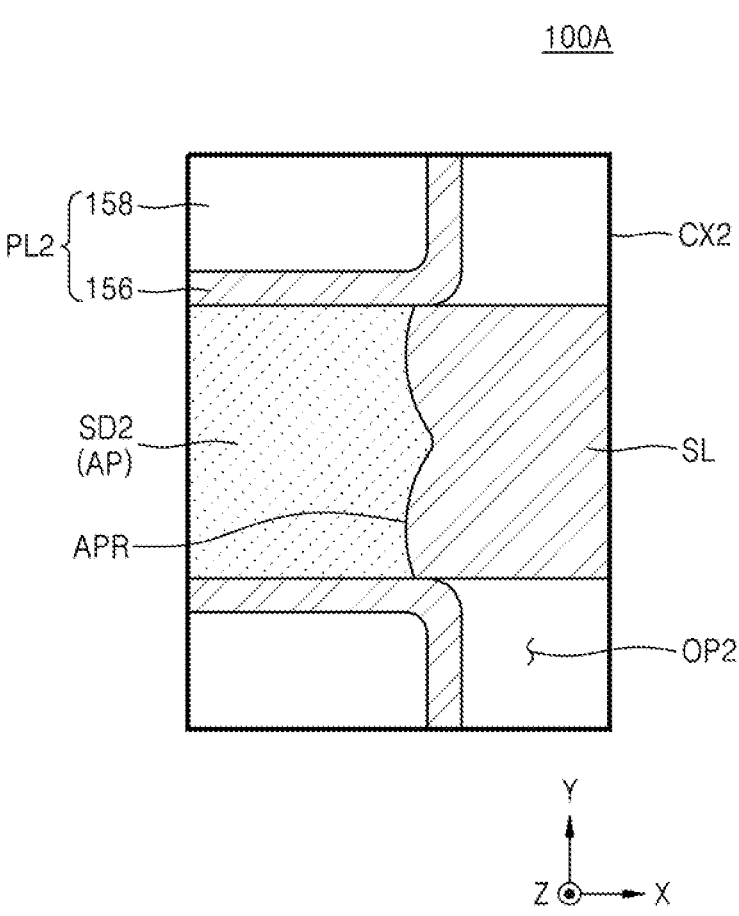

Referring to FIGS. 18A to 18C, the first gap-fill insulating layer 222 in the first openings OP1 may be removed, and a gate insulating layer 140 may be conformally formed in the first openings OP1. Thereafter, a conductive layer may be formed on both sidewalls of the first openings OP1 and the anisotropic etching process may be performed on the conductive layer to form a first gate electrode 130A1 and a second gate electrode 130A2 on both sidewalls of the first openings OP1.

Thereafter, a gap-fill insulating layer 142 filling a space between the first gate electrode 130A1 and the second gate electrode 130A2 may be formed.

Thereafter, a mask pattern may be formed on the mold stack MS, and a portion of the mold stack MS may be removed using the mask pattern as an etching mask to extend the first openings OP1 in the first horizontal direction X. Sidewalls of portions of the semiconductor pattern AP corresponding to a first impurity region SD1 and a second impurity region SD2 may be exposed through the extended first openings OP1.

A first vertical insulating structure PL1 and a second vertical insulating structure PL2 may be formed in the extended first openings OP1. In an implementation, the first vertical insulating structure PL1 may extend in the vertical direction Z on both sidewalls of a region of the semiconductor pattern AP in which the first impurity region SD1 is to be formed, and the second vertical insulating structure PL2 may extend in the vertical direction Z on both sidewalls of a region of the semiconductor pattern AP in which the second impurity region SD2 is to be formed.

Thereafter, impurities may be implanted into a portion of the semiconductor pattern AP by an ion implantation process to form the first impurity region SD1 and the second impurity region SD2. The first impurity region SD1 and the second impurity region SD2 may be formed by the ion implantation process, and a channel region CH between the first impurity region SD1 and the second impurity region SD2 may be defined.

In an implementation, the process of forming the first vertical insulating structure PL1 and the second vertical insulating structure PL2 may be performed prior to the process of forming the first and second gate electrodes 130A1 and 130A2. In an implementation, the ion implantation process of forming the first impurity region SD1 and the second impurity region SD2 may be performed prior to the process of forming the first vertical insulating structure PL1 and the second vertical insulating structure PL2.

Thereafter, the second gap-fill insulating layer 224 may be removed and the second opening OP2 may be exposed again. The sidewalls of the support layer SL and the lower-electrode sacrificial pattern 210P may be exposed again on the sidewalls of the second opening OP2.

Referring to FIGS. 19A to 19E, a side recess process may be performed on the lower-electrode sacrificial pattern 210P exposed by the second opening OP2. In the side recess process, the lower-electrode sacrificial pattern 210P (refer to FIG. 18A) may be removed, and sidewalls of the second impurity region SD2 of the semiconductor pattern AP may be exposed.

In an implementation, the side recess process may be performed by exposing the exposed sidewalls of the lower-electrode sacrificial pattern 210P to an etchant such as an etching gas through the second opening OP2. The side recess process may be performed during an etching time to remove about half of a width of the lower-electrode sacrificial pattern 210P in the second horizontal direction Y or remove about half of a height of the channel mold layer 210. In the side recess process, the sidewalls of the lower-electrode sacrificial pattern 210P corresponding to a total length L1 thereof (see FIG. 15C) (e.g., a length in the first horizontal direction X) may be exposed to an etching atmosphere, and the etchant may be sufficiently supplied in the second horizontal direction Y from the entire sidewalls of the lower-electrode sacrificial pattern 210P exposed through the second openings OP2.

In a manufacturing method according to a comparative example, a mold trench MT2 (see FIG. 23B) may be formed in an end of the lower-electrode sacrificial pattern 210P in a longitudinal direction (the first horizontal direction X) in a state in which the sidewalls of the lower-electrode sacrificial pattern 210P are blocked by the second gap-fill insulating layer 224, and the lower-electrode sacrificial pattern 210P may be removed from the mold trench MT2 in the longitudinal direction (the first horizontal direction X). According to this comparative method, a supply path of the etchant and a path of movement of removed materials may be relatively long, and it may be difficult to accurately control an etching process, e.g., a part of the lower-electrode sacrificial pattern 210P may not be completely removed.

On the other hand, according to an embodiment, the lower-electrode sacrificial pattern 210P may be removed by performing the side recess process on the sidewalls thereof and thus the supply path of the etchant and the path of movement of removed materials may be significantly reduced. Accordingly, a time to perform the etching process to remove the lower-electrode sacrificial pattern 210P may be reduced, and the accuracy of the process of etching the lower-electrode sacrificial pattern 210P may be improved.

A space remaining after the lower-electrode sacrificial pattern 210P is removed by the side recess process may be referred to as a first mold trench MT1. The top and bottom surfaces of the support layer SL and the sidewalls of the semiconductor pattern AP may be exposed through the first mold trench MT1. In an implementation, as illustrated in FIG. 19D, a sidewall of the semiconductor pattern AP may be located on the same plane as a sidewall of the second vertical insulating structure PL2.

In an implementation, in the side recess process, a sidewall of the semiconductor pattern AP adjacent to the second opening OP2 may be removed or recessed by a certain width due to exposure to the etchant. Accordingly, as illustrated in FIG. 19E, a pair of recessed portions APR (see FIG. 9) may be provided in the sidewall of the semiconductor pattern AP. In an implementation, the pair of recessed portions APR may be mirror symmetrical to each other with respect to the center line CL (see FIG. 9). In this case, the semiconductor memory device 100A described above with reference to FIGS. 8 and 9 may be obtained.

Figure 20A:
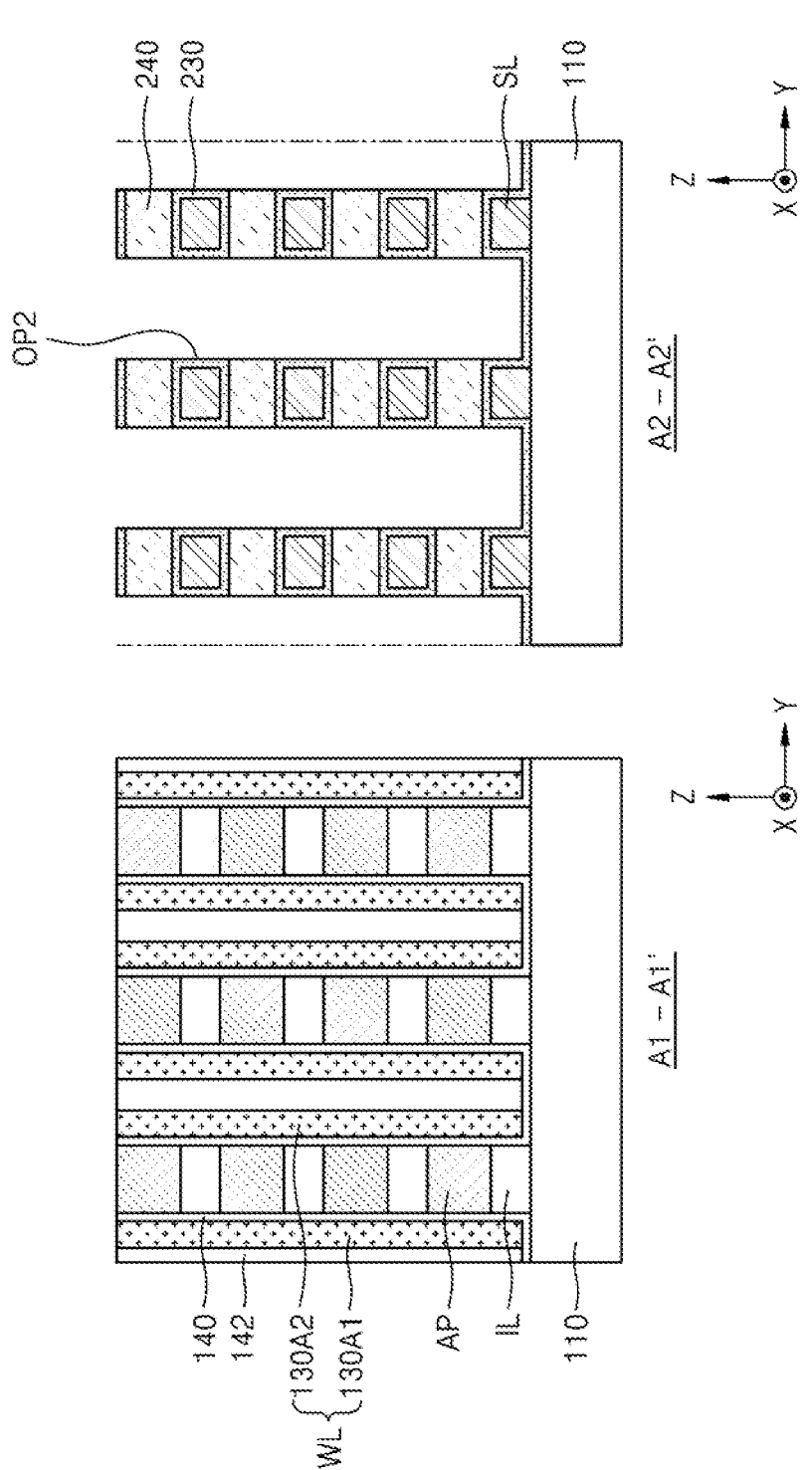
Figure 20B:
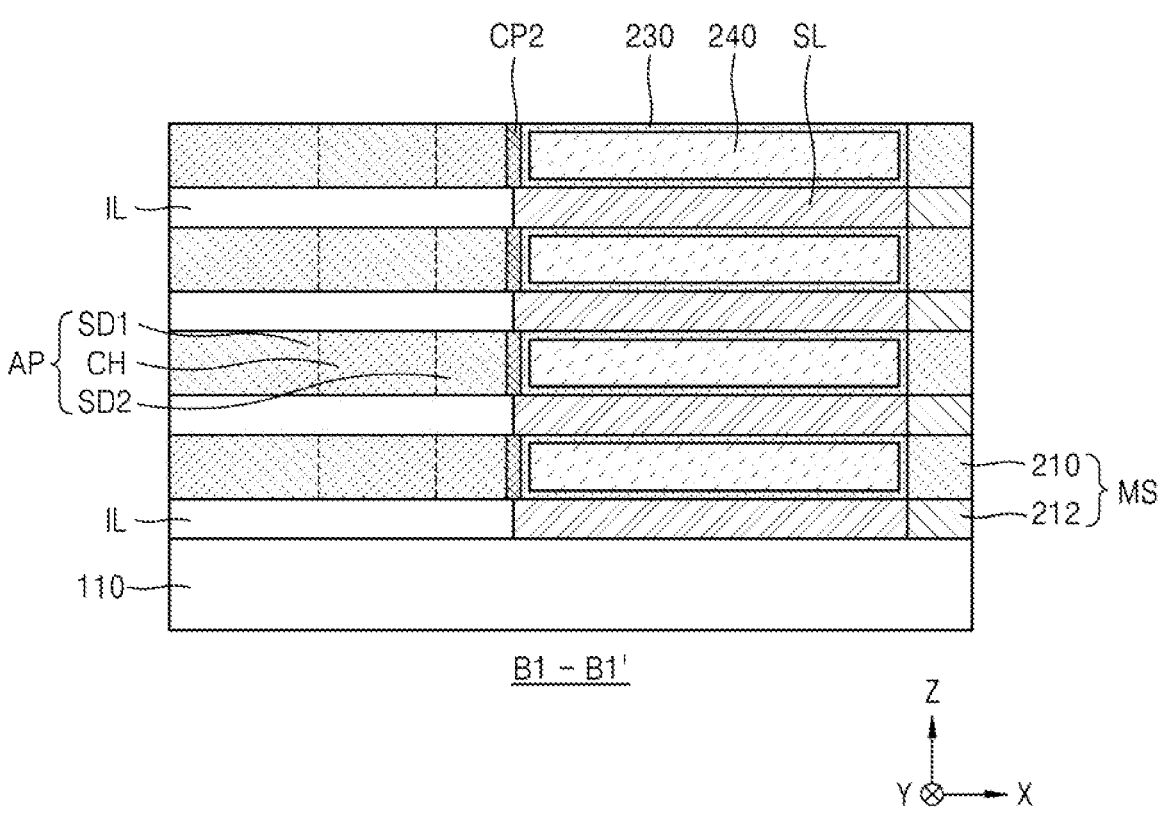

Referring to FIGS. 20A and 20B, a barrier metal layer 230 may be formed on the sidewalls of the semiconductor pattern AP, the sidewalls of the second vertical insulating structure PL2, and the surface of the support layer SL, which are exposed after the lower-electrode sacrificial pattern 210P is removed, and a heat treatment process may be performed on the barrier metal layer 230 to form a capacitor contact layer CP2 between the sidewalls of the semiconductor pattern AP and the barrier metal layer 230.

In an implementation, the barrier metal layer 230 may be formed of titanium, tantalum, cobalt, tungsten, titanium nitride, or tantalum nitride. In an implementation, the barrier metal layer 230 may be formed by a chemical vapor deposition (CVD) process, a physical vapor deposition (PVD) process, an atomic layer deposition (ALD) process, a metal organic CVD process, or a metal organic ALD process. The barrier metal layer 230 may be formed to a thickness of about 20 nm to about 100 nm.

In an implementation, in the heat treatment process, silicidation may occur between silicon included in the exposed surface of the semiconductor pattern AP and a metal material of the barrier metal layer 230 in contact with the semiconductor pattern AP, thus forming a capacitor contact layer CP2 including a metal silicide material.

In the process of forming the barrier metal layer 230 to form the capacitor contact layer CP2, the barrier metal layer 230 may be formed on a surface exposed by the second opening OP2 and the first mold trench MT1 and a source material of the barrier metal layer 230 may be smoothly supplied to the sidewalls of the semiconductor pattern AP. Accordingly, the barrier metal layer 230 may be formed to a relatively large thickness on the entire sidewalls of the semiconductor pattern AP and the accuracy of a process of forming the barrier metal layer 230 may be improved.

In a manufacturing method according to a comparative example, the lower-electrode sacrificial pattern 210P may be removed in the longitudinal direction (the first horizontal direction X) while the sidewalls of the lower-electrode sacrificial pattern 210P are blocked by the second gap-fill insulating layer 224, and the barrier metal layer 230 may be formed in a space from which the lower-electrode sacrificial pattern 210P is removed. In this case, an aspect ratio in the longitudinal direction of the lower-electrode sacrificial pattern 210P may be large, and it may be difficult to form the barrier metal layer 230 to a sufficiently large thickness on the semiconductor pattern AP. Accordingly, the capacitor contact layer CP2 may be formed to a thin or non-uniform thickness due to a reaction between the components of the semiconductor pattern AP and the barrier metal layer 230, thereby causing an undesired increase in electrical resistance between a cell transistor and a cell capacitor.

On the other hand, according to an embodiment, the barrier metal layer 230 may be formed to a relatively large thickness on the entire sidewalls of the semiconductor pattern AP and thus the capacitor contact layer CP2 may also be formed uniformly to a relatively large thickness.

Thereafter, an insulating layer may be formed on the barrier metal layer 230 to fill the inside of the first mold trench MT1, and an etch back process or a wet etching process may be performed on the insulating layer so that the barrier metal layer 230 on the sidewall of the support layer SL is exposed, thereby forming the first gap-fill material layer 240.

The first gap-fill material layer 240 may fill a space between two adjacent support layers SL, and the sidewalls of the barrier metal layer 230 may not be covered by the first gap-fill material layer 240 and may be exposed through the second opening OP2.

Figure 21:
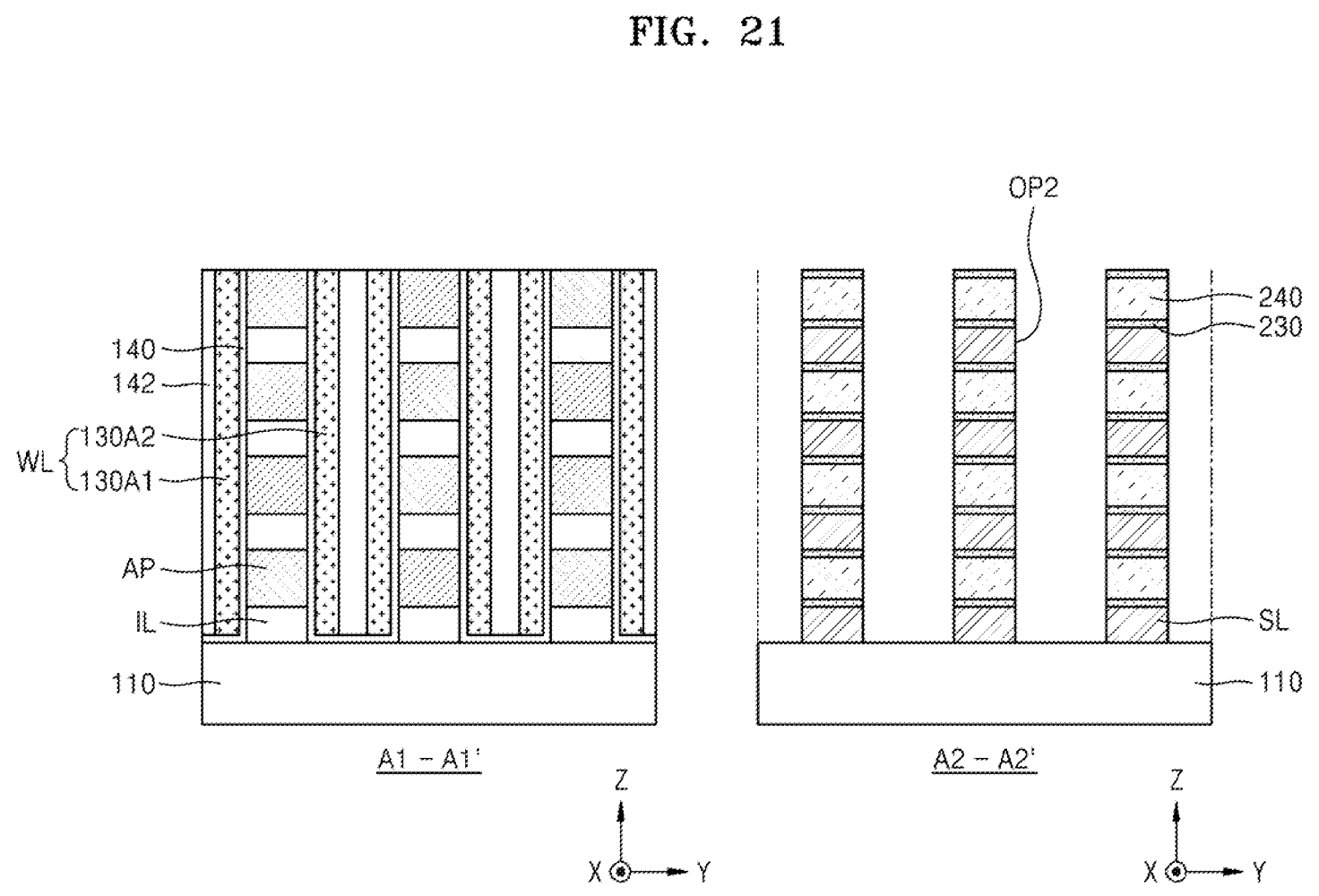

Referring to FIG. 21, the etch back process or the wet etching process may be performed on the barrier metal layer 230 and the first gap-fill material layer 240 so that the sidewalls of the support layer SL are exposed. Accordingly, a portion of the barrier metal layer 230 covering the sidewalls of the support layer SL may be removed, and the sidewalls of the support layer SL may be exposed through the second opening OP2.

In an implementation, a portion of the first gap-fill material layer 240 may be also removed in the etch-back or wet etching process, so that the sidewalls of the first gap-fill material layer 240 and the sidewalls of the barrier metal layer 230 may be aligned with each other. Accordingly, a vertical plate type structure in which the support layer SL, the barrier metal layer 230, and the first gap-fill material layer 240 are stacked may be formed.

Referring to FIGS. 22A to 22F, a side mold layer 250 may be formed on sidewalls of a structure in which the support layer SL, the barrier metal layer 230, and the first gap-fill material layer 240 are stacked, and thereafter, a second gap-fill material layer 260 filling the second opening OP2 may be formed on the side mold layer 250.

In an implementation, the side mold layer 250 may be formed of a material having an etch selectivity with respect to the support layer SL, the barrier metal layer 230 and the first gap-fill material layer 240. In an implementation, the side mold layer 250 may be formed of polysilicon, silicon nitride, silicon oxynitride, silicon carbon nitride, or silicon carbon oxide.

In an implementation, the sidewalls of the support layer SL, the sidewalls of the barrier metal layer 230, and the sidewalls of the first gap-fill material layer 240 may be aligned with one another and thus the structure may have relatively flat sidewalls. In this case, as illustrated in FIG. 22D, the side mold layer 250 may have relatively flat sidewalls and thus may cover the sidewalls of the support layer SL, the sidewalls of the barrier metal layer 230, and the sidewalls of the first gap-fill material layer 240.

In an implementation, a portion of the first gap-fill material layer 240 may also be removed during the etch-back or wet etching process of the barrier metal layer 230 and thus the sidewalls of the first gap-fill material layer 240 may be recessed inward with respect to the sidewalls of the barrier metal layer 230. As illustrated in FIG. 22E, the sidewalls of the first gap-fill material layer 240 may be recessed inward, and the sidewalls of the side mold layer 250 in contact with the sidewalls of the first gap-fill material layer 240 may be also concave. In this case, the semiconductor memory device 100A described above with reference to FIGS. 8 and 9 may be obtained.

In an implementation, both the barrier metal layer 230 and the first gap-fill material layer 240 may have concave sidewalls according to the thickness of the barrier metal layer 230 and an etching atmosphere in the etch back or wet etching process of the barrier metal layer 230. As illustrated in FIG. 22F, both the barrier metal layer 230 and the first gap-fill material layer 240 may have concave sidewalls, and a plurality of curved portions may be provided on the sidewalls of the side mold layer 250 in contact with the barrier metal layer 230 and the first gap-fill material layer 240. In this case, the semiconductor memory device 100B described above with reference to FIGS. 10 and 9 may be obtained.

Referring back to FIGS. 22B and 22C, a mask pattern may be formed on the mold stack MS, and a portion of the mold stack MS may be removed using the mask pattern as an etching mask to form a bit line opening BLH. Thereafter, a portion of the channel mold layer 210 exposed through the bit line opening BH may be removed, and bit lines BL may be formed of a conductive material in a region from which the channel mold layer 210 is removed. Before the bit lines BL are formed, a contact layer CP1 may be further formed of a metal silicide material between the bit lines BL and the semiconductor pattern AP. Thereafter, a bit line insulating layer BIL filling the inside of the bit line opening BH may be formed of an insulating material.

Thereafter, a mask pattern may be formed on the mold stack MS, and a portion of the mold stack MS may be removed using the mask pattern as an etching mask to form a second mold trench MT2. By forming the second mold trench MT2, portions of the channel mold layer 210 and the sacrificial mold layer 212 on an end of the mold stack MS in the first horizontal direction X may be removed. In addition, a sidewall of the first gap-fill material layer 240 may be exposed through the second mold trench MT2.

Figure 23A:
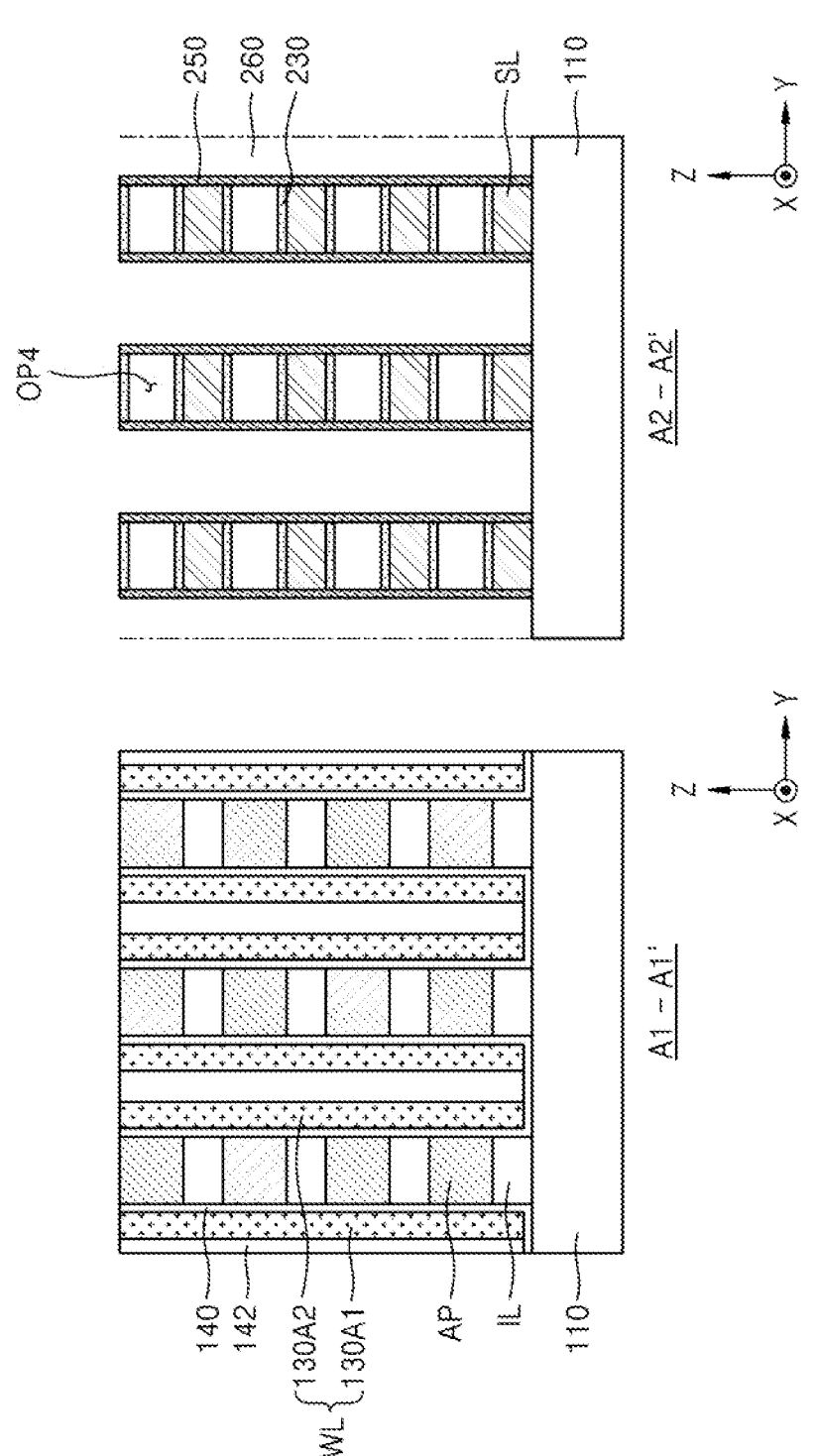
Figure 23B:
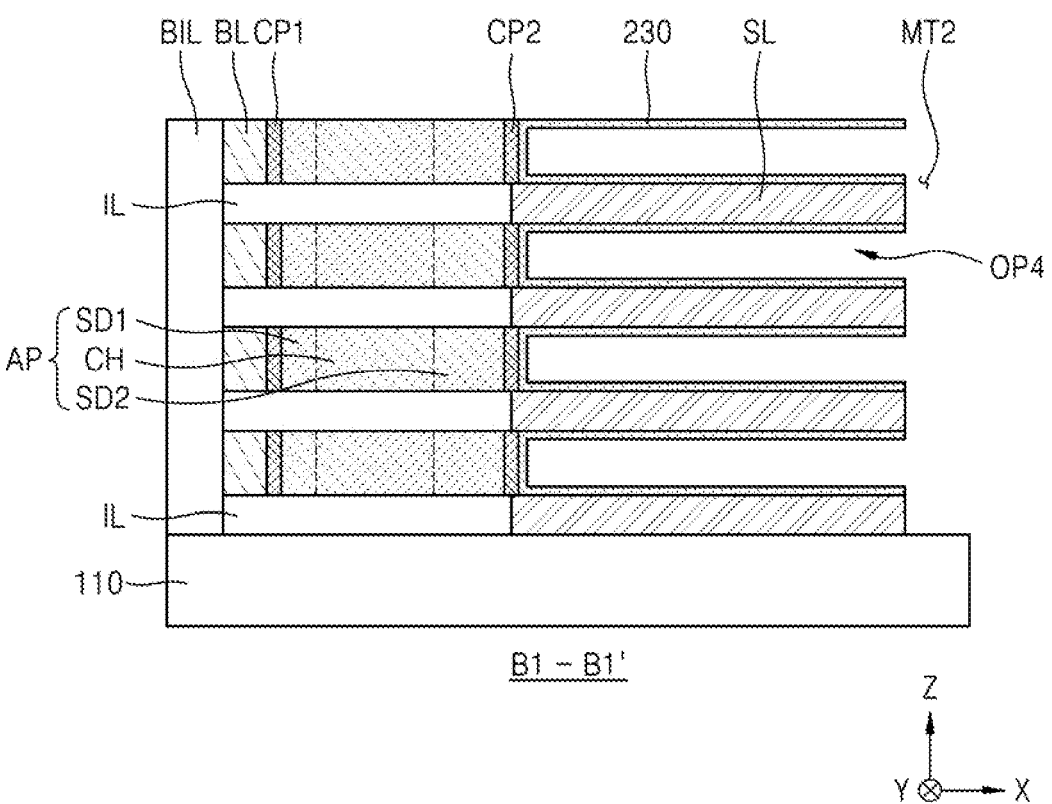

Referring to FIGS. 23A and 23B, the first gap-fill material layer 240 (see FIG. 22A) exposed through the second mold trench MT2 may be removed to form a fourth opening OP4. In the process of removing the first gap-fill material layer 240, the second gap-fill material layer 260 may also be removed and a sidewall of the side mold layer 250 may be exposed.

In an implementation, the process of removing the first gap-fill material layer 240 and the second gap-fill material layer 260 may be a wet etching process.

The fourth opening OP4 may be a space defined by two barrier metal layers 230 spaced apart from each other in the vertical direction Z and two side mold layers 250 spaced apart from each other in the second horizontal direction Y, after the first gap-fill material layer 240 is removed. One end of the fourth opening OP4 in the longitudinal direction (e.g., the first horizontal direction X) may be in communication with (e.g., open to) the second mold trench MT2, and another end of the fourth opening OP4 in the longitudinal direction may expose the capacitor contact layer CP2 and a portion of the barrier metal layer 230 in contact with the capacitor contact layer CP2.

Figure 24A:
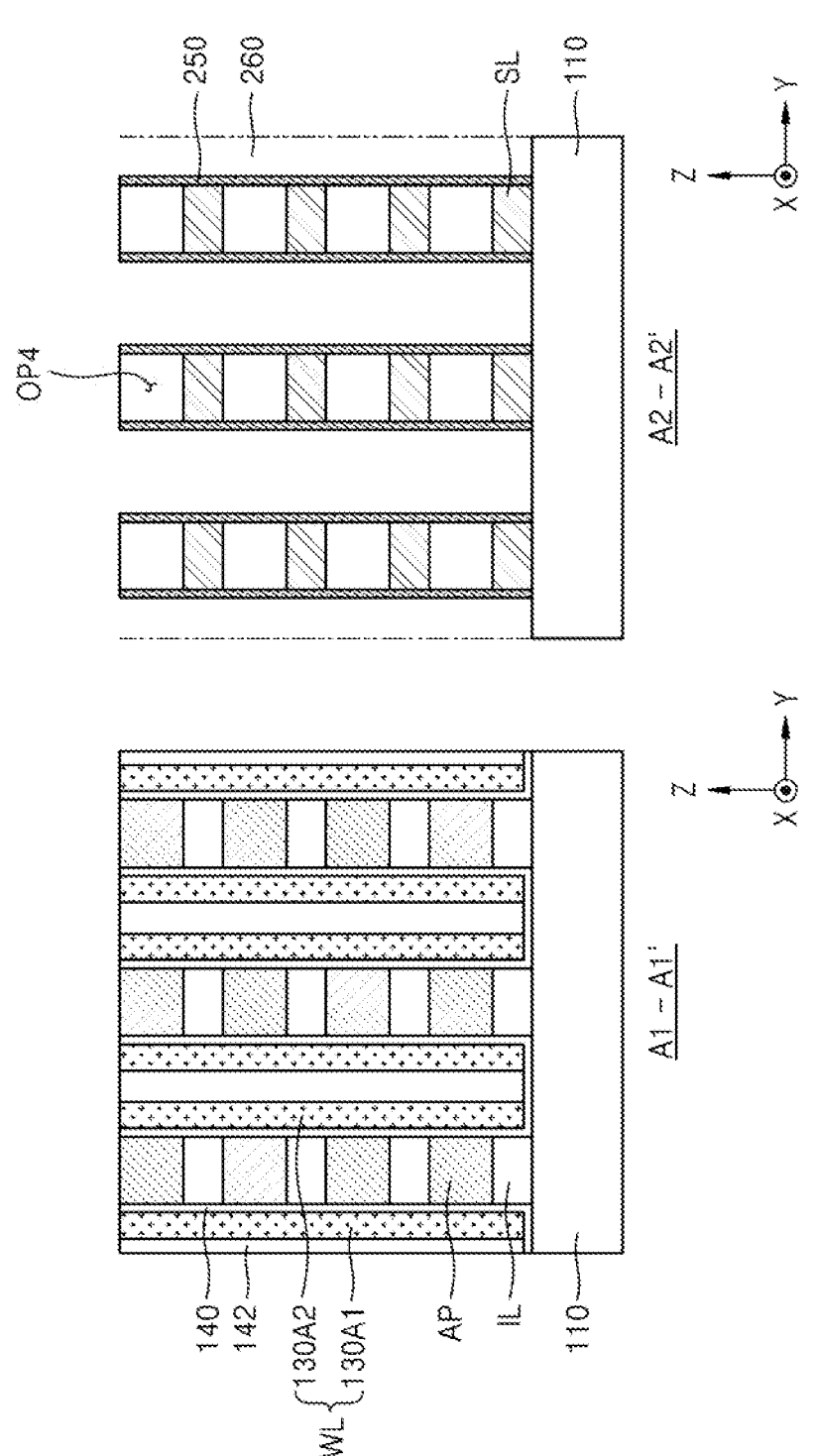
Figure 24B:
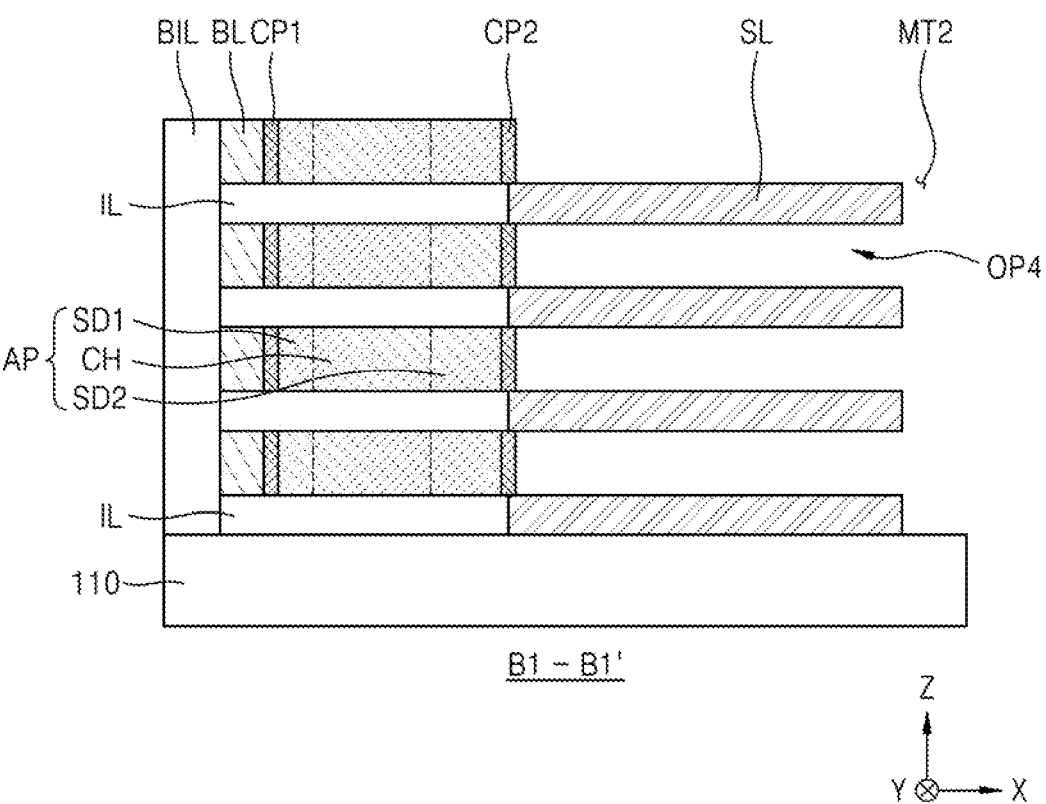

Referring to FIGS. 24A and 24B, the barrier metal layer 230 (see FIG. 23A) exposed in the fourth opening OP4 may be removed. A process of removing the barrier metal layer 230 may be a wet etching process.

After the barrier metal layer 230 is removed, the fourth opening OP4 may be defined by two support layers SL spaced apart from each other in the vertical direction Z and two side mold layers 250 spaced apart from each other in the second horizontal direction Y.

Figure 25A:
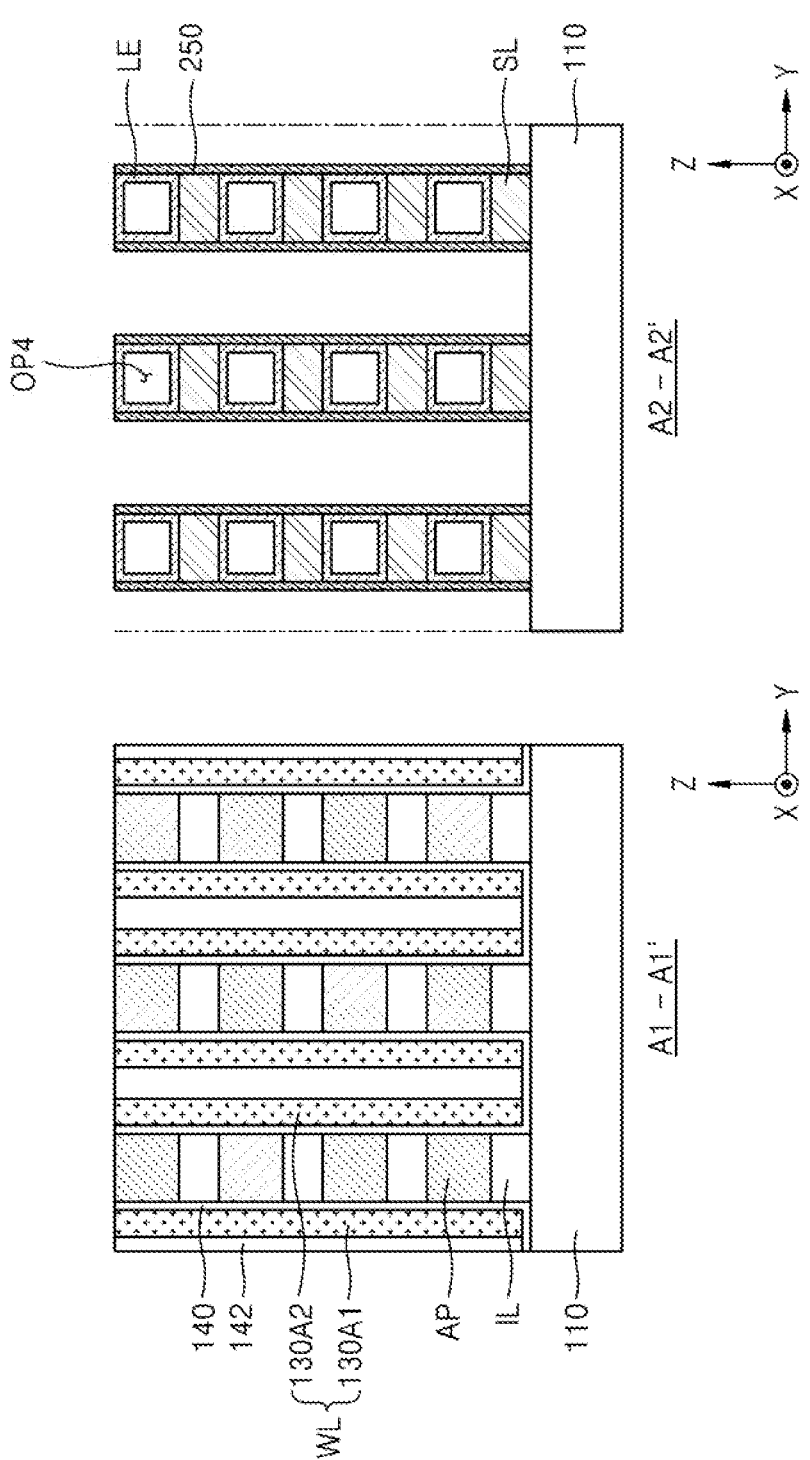
Figure 25B:
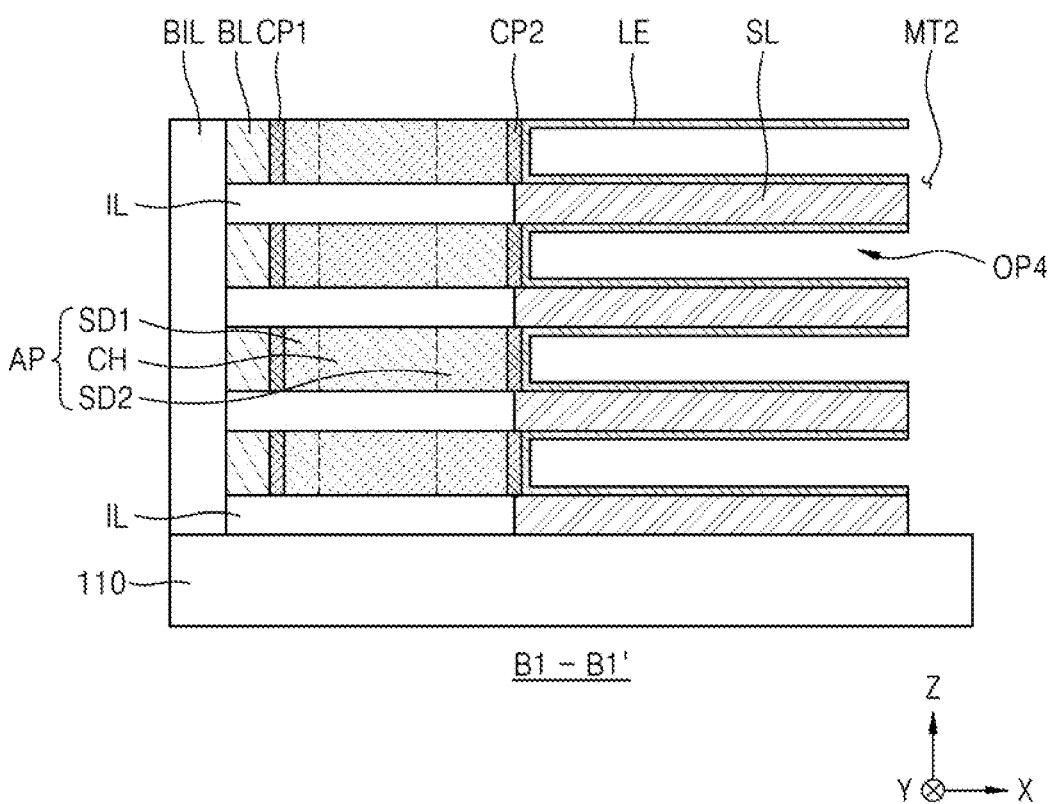

Referring to FIGS. 25A and 25B, a lower electrode LE may be formed on an inner wall of the fourth opening OP4.

In an implementation, a conductive layer may be conformally formed on sidewalls of the support layer SL and the side mold layer 250 in the fourth opening OP4, and a portion of the conductive layer on the sidewall of the support layer SL exposed in the second mold trench MT2 may be removed to separate nodes, thereby forming lower electrodes LE in the fourth opening OP4. The lower electrodes LE may be formed in the space (e.g., the inside of the fourth opening OP4) defined by two support layers SL spaced apart from each other in the vertical direction X and two side mold layers 250 spaced apart from each other in the second horizontal direction Y. Each of the lower electrodes LE may not be connected to a lower electrode LE adjacent thereto.

In an implementation, a gap-fill insulating layer may be further formed in the fourth opening OP4 to separate nodes by removing a portion of the conductive layer on the sidewall of the support layer SL exposed in the second mold trench MT2. In this case, after filling the inside of the fourth opening OP4 with the gap-fill insulating layer, a portion of the conductive layer on the sidewall of the support layer SL may be removed during the removing of the gap-fill insulating layer in the second mold trench MT2.

Figure 26A:
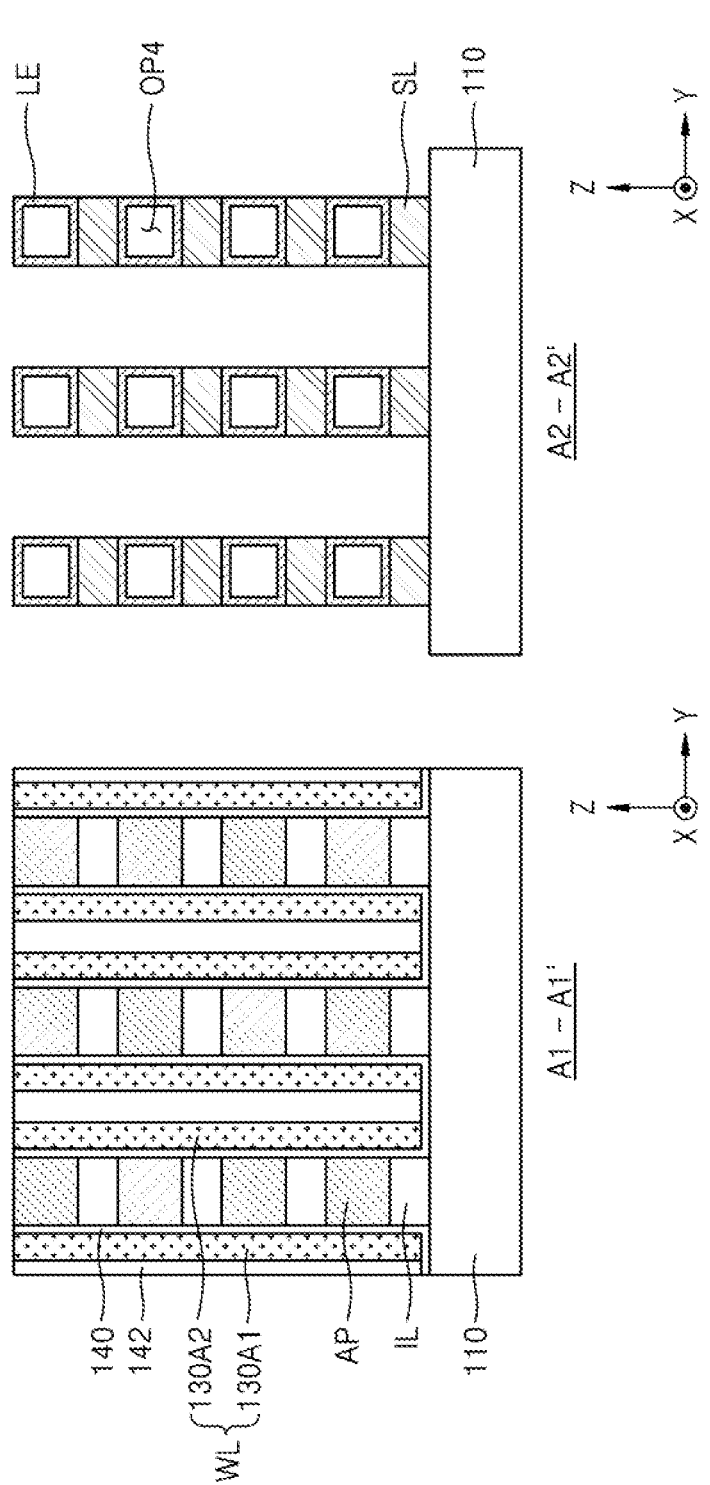
Figure 26B:
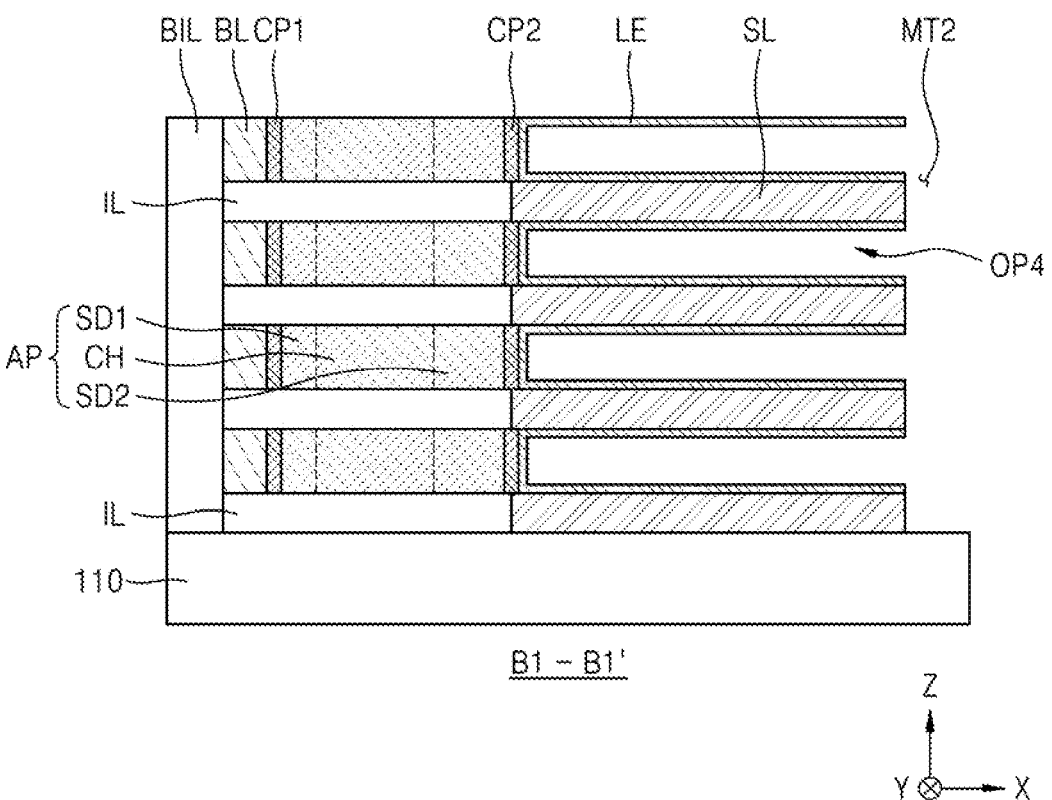

Referring to FIGS. 26A and 26B, the side mold layer 250 (see FIG. 25A) may be removed, and the sidewalls of the lower electrode LE and the sidewalls of the support layer SL may be exposed.

The lower electrode LE and the support layer SL may be alternately provided in the vertical direction Z, and the support layer SL may help prevent the lower electrode LE from collapsing or tilting.

Figure 27A:
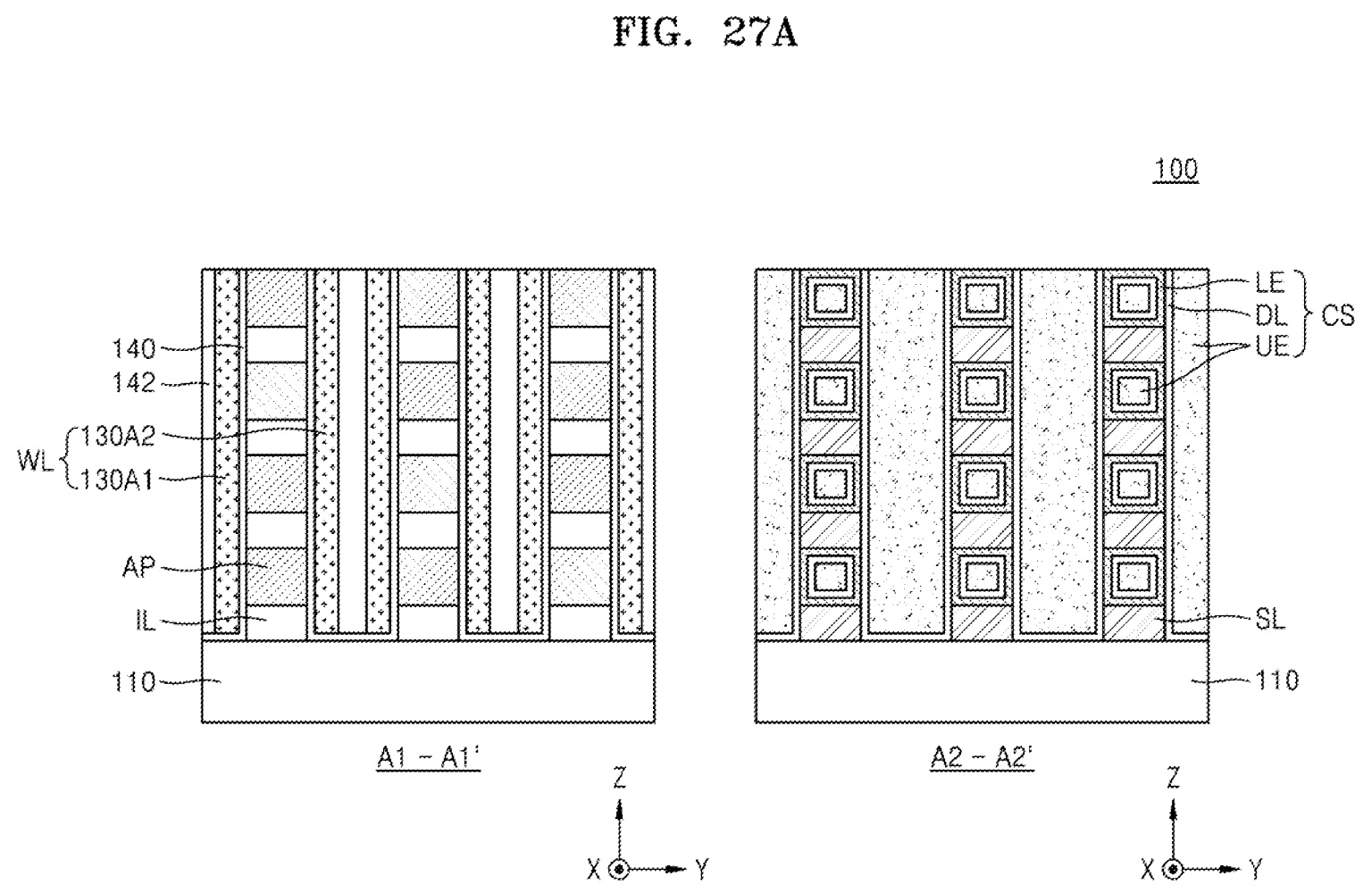
Figure 27B:
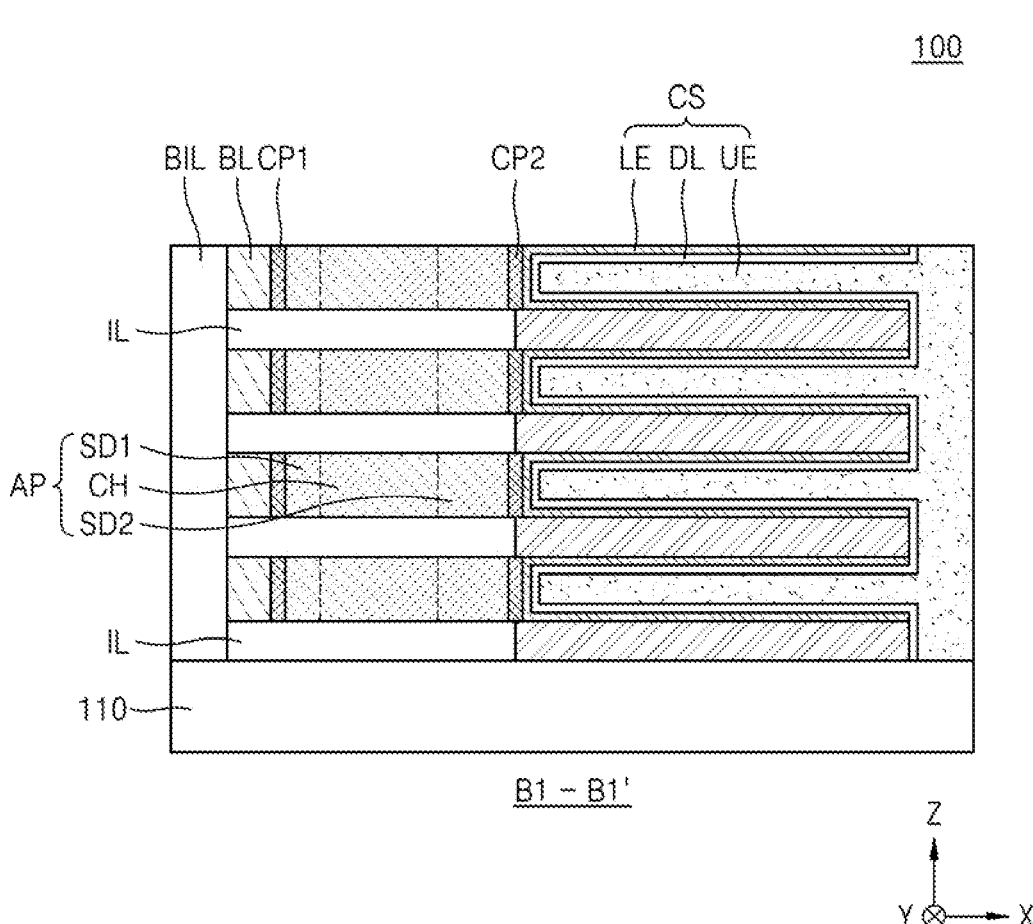

Referring to FIGS. 27A and 27B, a gate dielectric layer DL and an upper electrode UE may be formed on the sidewalls of the lower electrode LE and the sidewalls of the support layer SL.

In an implementation, the gate dielectric layer DL may be conformally provided on an inner wall of the lower electrode LE in the fourth opening OP4 and a pair of first sidewalls LES1 of the lower electrode LE, which are spaced apart from each other in the second horizontal direction Y. In addition, the gate dielectric layer DL may be also provided on the sidewalls of the support layer SL and the substrate 110.

By performing the above-described processes, the semiconductor memory device 100 may be completely manufactured.

In a method of manufacturing a semiconductor memory device according to a comparative example, the mold trench MT2 (see FIG. 23B) may be formed at an end of the lower-electrode sacrificial pattern 210P in the longitudinal direction (the first horizontal direction X), and the lower-electrode sacrificial pattern 210P may be removed from the mold trench MT2 in the longitudinal direction (the first horizontal direction X). According to this method, a supply path of an etchant and a path of movement of removed materials may be relatively long, and it may be difficult to accurately control an etching process, e.g., a portion of the lower-electrode sacrificial pattern 210P may not be completely removed.

In addition, the barrier metal layer 230 may be formed in a space from which the lower-electrode sacrificial pattern 210P is removed while the sidewall of the lower-electrode sacrificial pattern 210P is blocked by the gap-fill insulating layer 224. In this case, an aspect ratio in the longitudinal direction of the lower-electrode sacrificial pattern 210P may be large, and it may be difficult to form the barrier metal layer 230 to a sufficiently large thickness on the semiconductor pattern AP. Accordingly, the capacitor contact layer CP2 may be formed to a thin or non-uniform thickness due to a reaction between the components of the semiconductor pattern AP and the barrier metal layer 230, thereby causing an undesired increase in electrical resistance between a cell transistor and a cell capacitor.

On the other hand, according to an embodiment, the lower-electrode sacrificial pattern 210P may be removed by performing the side recess process on the sidewalls thereof and the supply path of the etchant and the path of movement of removed materials may be significantly reduced. Accordingly, a time to perform the etching process to remove the lower-electrode sacrificial pattern 210P may be reduced, and the accuracy of the process of etching the lower-electrode sacrificial pattern 210P may be improved.

In addition, the barrier metal layer 230 may be formed to a relatively large thickness on the entire sidewalls of the semiconductor pattern AP and thus the capacitor contact layer CP2 may also be formed uniformly to a relatively large thickness. Accordingly, electrical resistance between the lower electrode LE and the semiconductor pattern AP may reduce and thus the semiconductor memory device 100 may have excellent operating characteristics.

By way of summation and review, degrees of integration of two-dimensional (2D) semiconductor memory devices may be determined by an area occupied by unit memory cells, and the degrees of integration of 2D semiconductor memory devices may be increasing but may still be limited. A 3D semiconductor memory device has been considered, in which a plurality of memory cells are stacked on a substrate in a vertical direction to increase memory capacity.

One or more embodiments may provide a three-dimensional (3D) semiconductor memory device.

One or more embodiments may provide a three-dimensional (3D) semiconductor memory device with an increased degree of integration.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor memory device, the method comprising:

forming a mold stack on a substrate, the mold stack including a plurality of sacrificial mold layers and a plurality of channel mold layers alternately disposed in a vertical direction;

removing a first portion of the mold stack to form a plurality of first openings extending in the vertical direction and to form a plurality of lower electrode sacrificial patterns, wherein opposite sidewalls of each lower electrode sacrificial pattern are defined by two adjacent first openings from the plurality of first openings and extend in a first horizontal direction parallel with a top surface of the substrate;

removing a portion of each sacrificial mold layer exposed at a sidewall of the plurality of first openings to form a plurality of second openings, wherein a top surface and a bottom surface of each lower electrode sacrificial pattern are exposed at the second openings;

forming a plurality of support layers in the plurality of second openings;

forming a plurality of source/drain regions in a portion of each channel mold layer adjacent to the plurality of lower electrode sacrificial patterns;

removing the plurality of lower electrode sacrificial patterns by performing a side recess process to the plurality of lower electrode sacrificial patterns exposed at a sidewall of the plurality of first openings to expose the plurality of source/drain regions; and forming a plurality of lower electrodes at positions from which the plurality of lower electrode sacrificial patterns have been removed.

2. The method of claim 1, wherein:

the plurality of lower electrode sacrificial patterns vertically overlap the plurality of support layers, and the plurality of lower electrode sacrificial patterns and the plurality of support layers are disposed alternately with each other in the vertical direction.

3. The method of claim 1, wherein:

each lower electrode sacrificial pattern has a first length in the first horizontal direction, each lower electrode sacrificial pattern has a first width in a second horizontal direction parallel with the top surface of the substrate, and a ratio of the first length to the first width is between about 5 and about 400.

4. The method of claim 3, wherein, during the side recess process:

the top surface and the bottom surface of each lower electrode sacrificial pattern are covered by the plurality of support layers, and both of the opposite sidewalls of each lower electrode sacrificial pattern are exposed to an etching atmosphere over an entire length in the first horizontal direction.

5. The method of claim 3, wherein, during removing the plurality of lower electrode sacrificial patterns, a portion of each of the exposed plurality of source/drain regions is also removed to form a pair of recessed portions in each source/drain region.

6. The method of claim 5, wherein the pair of recessed portions are formed with mirror symmetry in relation to each other with respect to a center line of each source/drain region which extends in the first horizontal direction.

7. The method of claim 1, further comprising forming a barrier metal layer on a sidewall of each of the plurality of source/drain regions, prior to forming the plurality of lower electrodes.

8. The method of claim 7, wherein the barrier metal layer includes titanium, tantalum, cobalt, tungsten, titanium nitride, or tantalum nitride.

9. The method of claim 7, further comprising performing a heat treatment process on the barrier metal layer, prior to forming the plurality of lower electrodes.

10. The method of claim 7, wherein the barrier metal layer includes a pair of convex surfaces protruding toward the sidewall of each of the plurality of source/drain regions.

11. The method of claim 1, further comprising:

removing a second portion of the mold stack to form at least two third openings extending in the vertical direction and to form a plurality of semiconductor patterns, wherein opposite sidewalls of each semiconductor pattern are defined by two adjacent third openings and extend in the first horizontal direction; and forming a bit line connected to an end of each semiconductor pattern and extending in the vertical direction.

12. A method of manufacturing a semiconductor memory device, the method comprising:

forming a mold stack on a substrate, the mold stack including a plurality of sacrificial mold layers and a plurality of channel mold layers alternately disposed in a vertical direction;

removing a first portion of the mold stack to form a plurality of first openings extending in the vertical direction and to form a plurality of lower electrode sacrificial patterns, wherein opposite sidewalls of each lower electrode sacrificial pattern are defined by two adjacent first openings from the plurality of first openings and extend in a first horizontal direction parallel with a top surface of the substrate;

removing a portion of each sacrificial mold layer exposed at a sidewall of the plurality of first openings to form a plurality of second openings, wherein a top surface and a bottom surface of each lower electrode sacrificial pattern are exposed at the second openings;

forming a plurality of support layers in the plurality of second openings;

forming a plurality of source/drain regions in a portion of each channel mold layer adjacent to the plurality of lower electrode sacrificial patterns;

removing the plurality of lower electrode sacrificial patterns by performing a side recess process to the plurality of lower electrode sacrificial patterns exposed at a sidewall of the plurality of first openings to expose the plurality of source/drain regions, wherein each of the exposed plurality of source/drain regions includes a pair of recessed portions;

forming a barrier metal layer on a sidewall of the exposed plurality of source/drain regions; and forming a plurality of lower electrodes at positions from which the plurality of lower electrode sacrificial patterns have been removed.

13. The method of claim 12, wherein the barrier metal layer is between the plurality of lower electrodes and the plurality of source/drain regions.

14. The method of claim 12, wherein the pair of recessed portions are formed with mirror symmetry in relation to each other with respect to a center line of each of the plurality of source/drain regions which extends in the first horizontal direction.

15. The method of claim 13, wherein:

each lower electrode sacrificial pattern has a first length in the first horizontal direction, each lower electrode sacrificial pattern has a first width in a second horizontal direction parallel with the top surface of the substrate, and a ratio of the first length to the first width is between about 5 and about 400.

16. The method of claim 15, wherein, during the side recess process:

the top surface and the bottom surface of each lower electrode sacrificial pattern are covered by the plurality of support layers, and both opposite sidewalls of each lower electrode sacrificial pattern are exposed to an etching atmosphere over an entire length in the first horizontal direction.

17. The method of claim 13, wherein:

the barrier metal layer includes a pair of convex surfaces protruding toward the sidewall of each of the plurality of source/drain regions, and the pair of convex surfaces conform to a shape of the pair of recessed portions.

18. A method of manufacturing a semiconductor memory device, the method comprising:

forming a mold stack on a substrate, the mold stack including a plurality of sacrificial mold layers and a plurality of channel mold layers alternately disposed in a vertical direction;

removing a first portion of the mold stack to form a plurality of first openings extending in the vertical direction and to form a plurality of lower electrode sacrificial patterns, wherein opposite sidewalls of each lower electrode sacrificial pattern are defined by two adjacent first openings from the plurality of first openings and extend in a first horizontal direction parallel with a top surface of the substrate;

removing a portion of each sacrificial mold layer exposed at a sidewall of the plurality of first openings to form a plurality of second openings, wherein a top surface and a bottom surface of each lower electrode sacrificial pattern are exposed at the second openings;

forming a plurality of support layers in the plurality of second openings;

forming a plurality of source/drain regions in a portion of each channel mold layer adjacent to the plurality of lower electrode sacrificial patterns;

removing the plurality of lower electrode sacrificial patterns exposed at sidewalls of the plurality of first openings to expose opposite sidewalls of each of the plurality of source/drain regions;

forming a barrier metal layer on the opposite sidewalls of each of the plurality of source/drain regions, wherein the barrier metal layer has a pair of convex surfaces protruding toward the sidewall of each of the plurality of source/drain regions; and forming a plurality of lower electrodes at positions from which the plurality of lower electrode sacrificial patterns have been removed.

19. The method of claim 18, further comprising:

removing a second portion of the mold stack to form at least two third openings extending in the vertical direction and to form a plurality of semiconductor patterns, wherein opposite sidewalls of each semiconductor pattern are defined by two adjacent third openings and extend in the first horizontal direction; and forming a bit line connected to an end of each semiconductor pattern and extending in the vertical direction.

20. The method of claim 18, wherein, during removing the plurality of lower electrode sacrificial patterns:

the top surface and the bottom surface of each lower electrode sacrificial pattern are covered by the plurality of support layers, and both opposite sidewalls of each lower electrode sacrificial pattern are exposed to an etching atmosphere over an entire length in the first horizontal direction.

* * * * *